US009252184B2

(12) United States Patent
Amikawa

(10) Patent No.: US 9,252,184 B2
(45) Date of Patent: Feb. 2, 2016

(54) SOLID-STATE IMAGING APPARATUS AND METHOD FOR DRIVING THE SAME

(71) Applicant: PANASONIC CORPORATION, Osaka (JP)

(72) Inventor: Hiroyuki Amikawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 223 days.

(21) Appl. No.: 14/036,066

(22) Filed: Sep. 25, 2013

(65) Prior Publication Data

US 2014/0027617 A1 Jan. 30, 2014

Related U.S. Application Data

(63) Continuation of application No. PCT/JP2012/002596, filed on Apr. 13, 2012.

(30) Foreign Application Priority Data

Apr. 22, 2011 (JP) ................................. 2011-096384

(51) Int. Cl.
*H01L 27/148* (2006.01)
*H01L 27/146* (2006.01)
(Continued)

(52) U.S. Cl.
CPC .... *H01L 27/14806* (2013.01); *H01L 27/14621* (2013.01); *H01L 27/14623* (2013.01); *H01L 27/14627* (2013.01); *H04N 5/361* (2013.01); *H04N 5/374* (2013.01)

(58) Field of Classification Search
CPC .................. H01L 27/14806; H01L 27/14621; H01L 27/14623; H01L 27/14627; H01L 27/1462; H01L 27/146; H01L 27/14625; H01L 27/1461; H04N 5/361; H04N 5/374; H04N 5/365; H04N 5/3651; H04N 5/3653; H04N 5/3655; H04N 5/3658; H04N 5/359; H04N 5/3568; H04N 5/363
See application file for complete search history.

(56) References Cited

U.S. PATENT DOCUMENTS 6,344,877 B1 * 2/2002 Gowda et al. ................. 348/245
7,852,386 B2 * 12/2010 Aoki ............................. 348/245
(Continued)

FOREIGN PATENT DOCUMENTS

JP 2009-177378 A 8/2009
JP 2009-253819 A 10/2009
(Continued)

OTHER PUBLICATIONS

International Search Report issued in International Patent Application PCT/JP2012/002596 on May 22, 2012; 3 pages.

*Primary Examiner* — John Lee
(74) *Attorney, Agent, or Firm* — McDermott Will & Emery LLP

(57) ABSTRACT

A solid-state imaging apparatus includes a pixel array in which pixels are arranged in a matrix. Each pixel includes a photoelectric conversion element, a transfer transistor, an amplifier transistor, and a reset transistor. The pixel array an effective pixel part in which light enters the photoelectric conversion element and which is configured to output a video signal, an optical black pixel part in which the photoelectric conversion element is shielded from light and which is configured to output a reference signal, and a dummy pixel part. Of pixels connected to the same signal output line, effective pixels of the effective pixel part are configured such that a first potential is supplied from the reset transistor to a floating diffusion part, and clipping pixels of the dummy pixel part are configured such that a second potential is supplied from the reset transistor to the floating diffusion part.

14 Claims, 17 Drawing Sheets

(51) Int. Cl.
*H04N 5/361* (2011.01)
*H04N 5/374* (2011.01)

(56) References Cited

U.S. PATENT DOCUMENTS

| | | | |
|---|---|---|---|
| 7,906,752 B2 * | 3/2011 | Fukuoka et al. | 250/208.1 |
| 7,994,461 B2 * | 8/2011 | Koshiba | 250/208.1 |
| 8,040,416 B2 * | 10/2011 | Fukuoka | 348/301 |
| 8,610,802 B2 * | 12/2013 | Gomi | 348/245 |
| 2006/0114342 A1 * | 6/2006 | Egawa | 348/241 |
| 2006/0114343 A1 * | 6/2006 | Zhang et al. | 348/294 |
| 2006/0203112 A1 * | 9/2006 | Aoki | 348/294 |
| 2007/0131846 A1 * | 6/2007 | Eskerud | 250/208.1 |
| 2008/0054320 A1 * | 3/2008 | Solhusvik et al. | 257/292 |
| 2008/0258047 A1 * | 10/2008 | Sakakibara et al. | 250/214 C |
| 2008/0291290 A1 * | 11/2008 | Sonoda et al. | 348/222.1 |
| 2009/0079856 A1 * | 3/2009 | Yahazu | 348/294 |
| 2009/0109312 A1 * | 4/2009 | Noda et al. | 348/304 |
| 2009/0184238 A1 | 7/2009 | Fukuoka et al. | |
| 2009/0284634 A1 * | 11/2009 | Tsukimura | 348/308 |
| 2009/0322925 A1 * | 12/2009 | Barna et al. | 348/308 |
| 2010/0085448 A1 * | 4/2010 | Fukuoka | 348/241 |
| 2011/0032391 A1 * | 2/2011 | Cheung | 348/241 |
| 2011/0037882 A1 * | 2/2011 | Kukita et al. | 348/246 |
| 2011/0128420 A1 * | 6/2011 | Moore | 348/241 |
| 2011/0149135 A1 | 6/2011 | Yamanaka | |
| 2011/0267513 A1 * | 11/2011 | Sonoda et al. | 348/294 |
| 2011/0304751 A1 * | 12/2011 | Joboji et al. | 348/243 |
| 2012/0097841 A1 * | 4/2012 | Noda et al. | 250/208.1 |
| 2014/0027617 A1 * | 1/2014 | Amikawa | 250/208.1 |

FOREIGN PATENT DOCUMENTS

| | | |
|---|---|---|
| JP | 2009-278454 A | 11/2009 |
| JP | 2010-263443 A | 11/2010 |
| WO | 2010/023903 A1 | 3/2010 |

* cited by examiner

SOLID-STATE IMAGING APPARATUS AND METHOD FOR DRIVING THE SAME

CROSS-REFERENCE TO RELATED APPLICATIONS

This is a continuation of International Application No. PCT/JP2012/002596 filed on Apr. 13, 2012, which claims priority to Japanese Patent Application No. 2011-096384 filed on Apr. 22, 2011. The entire disclosures of these applications are incorporated by reference herein.

BACKGROUND

In recent years, digital cameras etc. including built-in solid-state imaging apparatuses have been widespread. It has been known that, in the solid-state imaging apparatuses, when high-brightness light having certain brightness or more enters, a black part into which light does not seem to enter may appear in an image. Such phenomenon is hereinafter referred to as "blocked-up shadows." As a technique for reducing or preventing the blocked-up shadows, the following technique (e.g., see Japanese Patent Publication No. 2009-177378 which is hereinafter referred to as "Patent Document 1") is disclosed.

FIG. 16 is a view illustrating a configuration of a solid-state imaging apparatus 100 of Patent Document 1. Referring to FIG. 16, the solid-state imaging apparatus 100 of Patent Document 1 includes pixels 110, vertical signal lines 111, a constant current source 112, a noise canceller circuit (correlated double sampling (CDS) circuit) 113, horizontal signal lines 114, and an output AMP 115. The plurality of pixels 110 are arranged in a matrix as unit pixels.

The pixel 110 includes a photodiode PD configured to perform photoelectric conversion, a transfer transistor MTR, a reset transistor MRS, an amplifier transistor MSF, and a floating diffusion part FD (hereinafter also referred to as an "FD part") configured to store charge.

First, the blocked-up shadows will be described. The voltage Vfd of the FD part drops due to entering of high-brightness light, and the potential Vpixout of the vertical signal line drops to equal to or lower than a permissible minimum value. As a result, even if signal charge is transferred from the photodiode PD to the FD part, the potential Vpixout cannot further drop. Thus, the blocked-up shadows occur.

The blocked-up shadows will be further described below with reference to FIG. 16 and a timing chart of FIG. 17. FIG. 17 is the timing chart illustrating a relationship among drive pulses in the solid-state imaging apparatus of Patent Document 1. In this case, a pixel from which an optical signal is read is a pixel 110<i>.

When high-brightness light enters a pixel region, the voltage Vfd at the floating diffusion part FD may drop to a permissible minimum value (floating diffusion part minimum voltage Vfdmin) during the period from the point at which a reset pulse φRS<i> is changed to a low level to the point at which a transfer pulse φTR<i> is changed to a high level. In such a case, the potential Vpixout of the vertical signal line also drops to a permissible minimum value (pixel output minimum voltage Vpixoutmin).

This is because of, e.g., the following reason: charge is generated not only at the photodiode PD but also at the FD part due to leakage of intense light into the FD part; or charge generated at the photodiode PD leaks into the FD part.

In the foregoing state, even if signal charge dependent on light is transferred to the FD part with the transfer pulse φTR<i> being changed to the high level, the voltage Vfd at the FD part cannot fall below the FD part minimum voltage Vfdmin.

Thus, the pixel output voltage Vpixout does not fall below the pixel output minimum voltage Vpixoutmin, and therefore the difference ΔVpixout(sig) between reset voltage and signal voltage is 0 (ΔVpixout(sig)=Vpixoutmin−Vpixoutmin=0). Finally, horizontal signal line optical signal voltage ΔVout (sig)=0.

As a result, at a place where high-brightness light having certain brightness or more enters, a black image is formed as if no light enters.

In order to reduce the blocked-up shadows, various suppressor circuits have been proposed. The following has been known as one of the suppressor circuits. For the pixel 110<i> from which an optical signal is read, clip voltage for reducing or preventing the blocked-up shadows is generated from an adjacent pixel 110<i+1>, and the pixel output voltage Vpixout is clipped.

Such a case will be described with reference to the timing chart of FIG. 17.

First, a power supply pulse φVdd<i> is changed to a reference reset pulse φVddr, and the reset pulse φRS<i> is changed to the high level. This sets FD part voltage Vfd<i> at reference reset voltage Vddr. Moreover, in order to clamp the reset voltage to the CDS circuit 113, a clamp pulse φCL and a sample-hold pulse φSH are changed to the high level.

Next, a power supply pulse φVdd<K> connected to a non-selected pixel 110<K> (not shown in FIG. 16) other than the reading pixel 110<i> and the clipping pixel 110<i+1> is set at non-selected pixel voltage Vddl which has a value lower than the minimum value Vpixoutmin for an optical signal flowing through the vertical signal line 111, and FD part voltage Vfd<K> of the non-selected pixel is set at the non-selected pixel voltage Vddl.

Then, the reset pulse φRS<i> is changed to the low level.

Thus, due to a kTC noise (reset noise) component Vktc<i> at a reset transistor MRS<i>, field-through voltage Vft<i>, and gate/source voltage Vgs<i> at an amplifier transistor MSF<i>, pixel output voltage Vpixout<i> is changed to reset voltage Vrst<i> (=Vddr−Vnoise<i>−Vgs<i>) which falls below the reference reset voltage Vddr. Note that noise Vnoise<i> of the reset transistor MRS<i> is represented by Vktc<i>+Vft<i>.

Next, a power supply pulse φVdd<i+1> is set at reference clip voltage Vddc (<Vddr). Moreover, a reset pulse φRS<i+1> is changed to the high level, and a transfer pulse φTR<i+1> is changed to the low level. This allows FD part voltage Vfd<i+1> to be set at the reference clip voltage Vddc. In such a state, since the reference clip voltage Vddc is voltage for generating clip voltage, the reference clip voltage Vddc is set at voltage lower than the reference reset voltage Vddr by Va (Vddc=Vddr−Va).

Next, while the reset voltage is sampled and held due to high-brightness light, the FD part voltage Vfd<i> drops to the minimum voltage Vfdmin<i> permitted at the FD part. Accordingly, the pixel output voltage Vpixout<i> also drops.

Meanwhile, at the pixel 110<i+1>, the following state is brought about: the reset pulse φRS<i+1> is at the high level, the transfer pulse φTR<i+1> is at the low level, and Vdd<i+1>=Vddc. This allows the FD part voltage Vfd<i+1> to be set at the reference clip voltage Vddc. Thus, the pixel output voltage Vpixout does not fall below clip voltage Vc<i+1> (=Vddc−Vgs<i+1>). That is, the pixel output voltage Vpixout is clipped at the clip voltage Vc<i+1>.

Next, in order to transfer a charge signal, the voltage of the vertical signal line 111 is dropped. Thus, the power supply pulse φVdd<i+1> of the pixel 110<i+1> is set at the non-selected pixel voltage Vddl, the clamp pulse φCL is changed to the low level, and the reset pulse φRS<i+1> is maintained at the high level.

Next, the transfer pulse φTR<i> of the pixel 110<i> is changed to the high level, and signal voltage is transferred as the pixel output voltage Vpixout<i>. In such a state, since the power supply pulse φVdd<K> and the power supply pulse φVdd<i+1> are both set at the non-selected pixel voltage Vddl, only the FD part voltage Vfd<i> of the pixel 110<i> is output as the pixel output voltage Vpixout<i>.

Subsequently, in order to read signals from a subsequent row, the power supply pulse φVdd<i+1> of the pixel 110<i+1> is set at the reference reset voltage Vddr. Then, the similar operation described above is performed to read a signal from the pixel 110<i+1> with a pixel 110<i+2> being used as a clipping pixel.

The foregoing operation is sequentially performed for each of the pixels arranged in an array pattern, thereby obtaining an image for which the blocked-up shadows are reduced. That is, when high-brightness light enters, no blocked-up shadows occur even if the pixel output voltage Vpixout<i> drops. When the pixel output voltage is Vpixout(sig)<i>, signal voltage of (Vc<i+1>−Vpixout(sig)<i>) can be obtained by the CDS circuit 113.

SUMMARY

With miniaturization of pixels, various techniques for reducing random noise have been recently developed in order to maintain a high image quality. As a result, increasing importance has been also attached to reduction in fixed pattern noise (FPN) of pixels which is buried in random noise.

In the foregoing blocked-up shadow suppressor circuit, the clipping pixel is in the proximity of the reading pixel, and therefore transistor variations are reduced. That is, since transistor characteristics of adjacent pixels are similar to each other, the variations are cancelled out. However, with reduction in random noise, it becomes insufficient for further FPN reduction to only reduce the transistor variations, and therefore fundamental measures are required.

According to the foregoing blocked-up shadow suppressor circuit and the foregoing driving method thereof, when a signal is read from the pixel 110<i>, noise occurs due to the clipping pixel 110<i+1>. Since such noise depends on characteristics of the pixel 110<i+1>, FPN occurs.

A mechanism for generating FPN at a pixel will be specifically described below with reference to FIG. 18. FIG. 18 illustrates drive timing in order to describe the FPN generation mechanism at the pixel in the drive method of the prior art. Note that the constant current source supplies ISF current during a period illustrated in FIG. 18.

First, at time t1, the reset pulse φRS<i> is changed to the high level, and the FD part voltage Vfd<i> is changed to the reference reset pulse Vddr at the reading pixel 110<i>. Accordingly, the potential of the vertical signal line 111 increases.

At time t2, the reset pulse φRS<i> is changed to the low level, and the reset pulse φRS<i+1> is changed to the high level. Thus, the FD part voltage Vfd<i+1> is changed to the reference clip voltage Vddc (<Vddr) at the clipping pixel 110<i+1>. Although not shown in this figure, the non-selected pixel voltage Vddl (<Vddc) is applied to the FD part of the pixel 110<K>, and an amplifier transistor MSF<K> is turned OFF.

In such a state, suppose that the reference clip voltage Vddc is applied to the FD part of the clipping pixel, and therefore leakage current 1_leak is generated at an amplifier transistor MSF<i+1>. In this case, current flowing through the amplifier transistor MSF<i> of the reading pixel drops to [ISF−1_leak] by the leakage current 1_leak. Moreover, when the amount of change in gate/source voltage Vgs due to the leakage current is ΔVgs_noise, the potential of the vertical signal line 111 is [Vfdr−Vgs<i>+ΔVgs_noise].

Subsequently, when the clamp pulse φCL of the CDS circuit 113 is changed from the high level to the low level at time t3, reference data in such a form that the potential of the vertical signal line 111 includes the change amount ΔVgs_noise is held.

Next, at time t4, power supply voltage Vdd<i+1> applied to the clipping pixel drops from the reference clip voltage Vddc to the non-selected pixel voltage Vddl. In such a state, the leakage current varies in an exponential manner depending on gate voltage. Thus, the leakage current 1_leak flowing through the amplifier transistor MSF<i+1> of the reading pixel drops so that the leakage current 1_leak can be ignored. As a result, the potential of the vertical signal line 111 in this state is [Vfdr−Vgs<i>], and the potential of Vcdsout is [Vcl−ΔVgs_noise].

Next, at time t5, the reset pulse φRS<i+1> is changed to the low level, and the potential of the FD part voltage Vfd<i+1> is maintained at the non-selected pixel voltage Vddl.

Next, at time t6, the transfer pulse φTR<i> is changed to the high level in order to read signal charge from the photodiode PD of the reading pixel. Subsequently, at time t7, the transfer pulse φTR<i> is changed to the low level.

Thus, the potential of the FD part voltage Vfd<i> is [Vfdr−ΔVsig] depending on the amount of charge of the photodiode PD. Depending on the change amount, the potential of the pixel output voltage Vpixout is [Vfdr−Vgs<i>+ΔVsig], and the potential of Vcdsout is [Vcl−ΔVgs_noise−ΔVsig].

At time t8, the sample-hold pulse φSH of the CDS circuit 113 is changed from the high level to the low level, and therefore a transistor MSH is turned OFF. Thus, a signal of the photodiode is held at Vcdsout. In such a state, the signal is [ΔVsig+ΔVgs_noise], and the noise ΔVgs_noise due to the clipping pixel is detected. This generates FPN at the pixel.

In order to reduce occurrence of FPN at the pixel, it is necessary to reduce the leakage current 1_leak when the reference clip voltage Vddc is applied to the clipping pixel.

In order to reduce the leakage current at the clipping pixel, the reference clip voltage Vddc to be applied may be lowered. However, if the reference clip voltage Vddc to be applied to the FD part of the clipping pixel is lowered, signal output when the blocked-up shadows occur is reduced. This is because, upon occurrence of the blocked-up shadows, a potential difference between the reference clip voltage Vddc and the non-selected pixel voltage Vddl is output as the signal output. Such a signal output level upon occurrence of the blocked-up shadows is required to be equal to or greater than the saturation output of the pixel, and therefore the reference clip voltage Vddc can be lowered only to a certain degree.

In the prior art, only a single pixel is assigned as the clipping pixel 110<i+1>. Thus, when the vertical signal line is clipped at desired clip voltage, a certain high voltage value is required as the reference clip voltage Vddc. However, if the reference clip voltage Vddc is high, FPN is generated at the pixel due to the leakage current 1_leak. Thus, there is a disadvantage that the reference clip voltage Vddc cannot be ensured within a settable range thereof.

When the clipping pixel is formed near the reading pixel, if the reading pixel is irradiated with high-brightness light causing the blocked-up shadows, it is highly likely to bring about the state in which the clipping pixel is also irradiated with the high-brightness light. In such a case, the reference clip voltage Vddc is applied to the FD part of the clipping pixel. However, signal charge for which photoelectric conversion is performed leaks from the photodiode, and is transferred to the FD part. As a result, the potential of the FD part is lowered, and the blocked-up shadows cannot be sufficiently reduced.

If the pixel from which a signal is read prior to the reading pixel is used as the clipping pixel, the clipping pixel is at a start row (i.e., at a lower end of the pixel array) when the reading pixel is at an end row (i.e., at an upper end of the pixel array). In such a case, variations in transistor characteristics are caused between the reading pixel and the clipping pixel.

In the case of a method for sequentially scanning the clipping pixels, there is a disadvantage that a scanning circuit becomes complicated.

For example, a single solid-state imaging apparatus typically has various drive modes. Specifically, a digital still camera has, e.g., a still mode for acquiring a still image, a monitor mode for display an image on a liquid crystal screen, and a movie mode for acquiring a video picture. In such a state, a method for scanning pixels is different depending on the drive modes. For example, each row of the pixels is sequentially accessed in the still mode, whereas scanning is performed with scanning for a certain line(s) being skipped in the monitor mode. Thus, it is necessary to scan the clipping pixels in accordance with each mode, and a circuit and driving extremely become complicated. This also results in an increase in circuit size.

Moreover, the clipping pixels are required to be accessed independently of reading rows and electronic shutter rows. Thus, a scanning circuit is required, and a chip area is substantially influenced.

In the view of the foregoing, the present disclosure provides a solid-state imaging apparatus which is capable of reducing blocked-up shadows without an increase in circuit size and which is capable of reducing variation in pixels due to FPN in a blocked-up reduction operation or completely removing the variation in pixels due to FPN. The present disclosure also provides a method for driving the solid-state imaging apparatus.

A solid-state imaging apparatus of the present disclosure includes a pixel array in which a plurality of unit pixels are arranged in a matrix. Each unit pixel includes a photoelectric conversion element configured to perform photoelectric conversion, a transfer transistor configured to transfer signal charge from the photoelectric conversion element to a floating diffusion part, an amplifier transistor configured to amplify the signal charge and output the amplified signal charge to a signal output line as an analog signal, and a reset transistor configured to reset the floating diffusion part by supplying a potential of a reset line to the floating diffusion part. The pixel array includes an effective pixel part which is formed in a light-irradiated pixel part where light enters the photoelectric conversion element and in which the signal charge is used as a video signal, an optical black pixel part which is formed in a light-shielded pixel part where the photoelectric conversion element is shielded from light and in which the signal charge is used as a reference signal, and a dummy pixel part arranged in part of the pixel array other than the effective pixel part and the optical black pixel part. A plurality of effective pixels of the effective pixel part and a plurality of dummy pixels of the dummy pixel part are connected to an identical signal output line. In each effective pixels connected to the identical signal output line, a first potential is supplied from the reset transistor to the floating diffusion part. In each of a plurality of clipping pixels of the dummy pixels connected to the identical signal output line, a second potential different from the first potential is supplied from the reset transistor to the floating diffusion part.

According to the foregoing solid-state imaging apparatus, since the dummy pixel part is used, blocked-up shadows can be reduced without providing an additional circuit for operating the clipping pixels. Thus, a circuit area can be reduced. Moreover, since the dummy pixels are used as the clipping pixels, a settable range of reference clip voltage can be extended, and variation in pixels due to FPN in a blocked-up reduction operation can be reduced.

The clipping pixels may be positioned in the light-shielded pixel part.

According to the foregoing, a drop in potential of the floating diffusion part due to high-brightness light at the clipping pixel can be avoided, and therefore an advantage that the blocked-up shadows are reduced can be further ensured.

The dummy pixel part may include first and second dummy pixel parts arranged so as to sandwich the effective pixel part, and the clipping pixels of the dummy pixels connected to the identical signal output line may be arranged in both of the first and second dummy pixel parts.

Constant current circuits configured to supply constant current to the signal output line may be arranged so as to sandwich the pixel array.

According to the foregoing, an influence of variation (e.g., variation due to a voltage drop etc. along a vertical signal line) due to the position of the effective pixel from which a signal is read can be reduced.

The reset line may be configured such that the potential thereof can be set for each row of the pixel array, and different potentials may be applied to the effective pixels and the clipping pixels through the reset line.

The solid-state imaging apparatus of the present disclosure may further include a unit configured to apply the second potential or a third potential lower than the second potential from the reset transistor to the floating diffusion part in each clipping pixel.

The solid-state imaging apparatus of the present disclosure may further include a first bias circuit configured to supply the second potential; and a second bias circuit configured to supply the third potential. The second and third potentials may be generated by using an identical reference potential.

According to the foregoing configuration, if the reference potential varies, the second and third potentials change in the same direction. Thus, such variation in reference potential can be cancelled out. Thus, an influence of the variation in reference potential can be reduced.

The second and third potentials may be generated from a bias circuit which includes a potential switching controller and which is capable of dynamically switching a potential.

Each unit pixel may further include a selector transistor, and the amplifier transistor may be, at one end thereof, connected to the signal output line through the selector transistor.

Each unit pixel may further include a selector transistor. The amplifier transistor may be, at one end thereof, connected to the signal output line through the selector transistor.

The reset line may be shared by each row of the pixel array.

In order to reduce the blocked-up shadows and FPN of the pixel, the foregoing configurations may be employed.

The solid-state imaging apparatus of the present disclosure may further include an analog-to-digital converter circuit arranged in parallel with each column of the pixel array and configured to convert the analog signal obtained at each unit pixel into a digital signal. The analog-to-digital converter circuit may include a comparator configured to compare a value for the signal output line to which the analog signal is output with a value for a reference line, and a counter configured to count a time until comparison performed by the comparator is completed and hold a comparison result. The comparator may include an initialization unit configured to initialize, before the comparison is performed, an operating point of the comparator based on predetermined values for the signal output line and the reference line. A control unit configured to change the value for the reference line after initialization may be provided.

The solid-state imaging apparatus of the present disclosure may include a unit configured to supply, after the initialization of the comparator and before a change in the value for the reference line, the third potential to the floating diffusion part of each clipping pixel. The third potential may be lower than the second potential.

According to the foregoing, variation in pixels due to FPN in the blocked-up shadow reduction operation can be radically removed.

The solid-state imaging apparatus of the present disclosure may further include an analog-to-digital converter circuit arranged in parallel with each column of the pixel array and configured to convert the analog signal obtained at each unit pixel into a digital signal. The analog-to-digital converter circuit may include a comparator configured to compare a value for the signal output line to which the analog signal is output with a value for a reference line, and a counter configured to count a time until comparison performed by the comparator is completed and hold a comparison result. The comparator may include an initialization unit configured to initialize, before the comparison is performed, an operating point of the comparator based on predetermined values for the signal output line and the reference line. A control unit configured to change the value for the reference line after initialization may be provided. After the initialization of the comparator and before a change in the value for the reference line, the selector transistor at a second unit pixel is brought into a non-conductive state.

According to the foregoing, variation in pixels due to FPN in the blocked-up shadow reduction operation can be also radically removed.

Next, a first method for driving a solid-state imaging apparatus is a method for driving a solid-state imaging apparatus including a pixel array in which a plurality of unit pixels are arranged in a matrix, an analog-to-digital converter circuit arranged in parallel with each column of the pixel array and configured to convert an analog signal obtained at each unit pixel into a digital signal, and a potential supply unit. Each pixel unit includes a photoelectric conversion element configured to perform photoelectric conversion, a transfer transistor configured to transfer signal charge from the photoelectric conversion element to a floating diffusion part, an amplifier transistor configured to amplify the signal charge and output the amplified signal charge to a signal output line as an analog signal, and a reset transistor configured to reset the floating diffusion part by supplying a potential of a reset line to the floating diffusion part. Of the unit pixels, a plurality of effective pixels in each of which the signal charge is used as a video signal and a plurality of clipping pixels other than the effective pixels are connected to an identical signal output line. In each effective pixel connected to the identical signal output line, the potential supply unit supplies a first potential from the reset transistor to the floating diffusion part. In each clipping pixel connected to the identical signal output line, the potential supply unit supplies a second potential different from the first potential from the reset transistor to the floating diffusion part. The analog-to-digital converter circuit includes a comparator configured to compare a value for the signal output line to which the analog signal is output and a value for a reference line, and a counter configured to count a time until comparison performed by the comparator is completed and hold a comparison result. The comparator includes an initialization unit configured to initialize, before the comparison is performed, an operating point of the comparator based on predetermined values for the signal output line and the reference line. A control unit configured to change the value for the reference line after initialization is provided. The method includes a step (a) of initializing the comparator; a step (b) of applying, after the step (a), a third potential lower than the second potential from the reset transistor to the floating diffusion part at at least one of the unit pixels; and a step (c) of changing, after the step (b), the value for the reference line.

According to the foregoing drive method, the blocked-up shadows can be reduced, and variation in pixels due to FPN can be reduced.

Next, a second method for driving a solid-state imaging apparatus is a method for driving a solid-state imaging apparatus including a pixel array in which a plurality of unit pixels are arranged in a matrix, an analog-to-digital converter circuit arranged in parallel with each column of the pixel array and configured to convert an analog signal obtained at each unit pixel into a digital signal, and a potential supply unit. Each pixel unit includes a photoelectric conversion element configured to perform photoelectric conversion, a transfer transistor configured to transfer signal charge from the photoelectric conversion element to a floating diffusion part, an amplifier transistor configured to amplify the signal charge and output the amplified signal charge to a signal output line as an analog signal, and a reset transistor configured to reset the floating diffusion part by supplying a potential of a reset line to the floating diffusion part. Of the unit pixels, a plurality of effective pixels in each of which the signal charge is used as a video signal and a plurality of clipping pixels other than the effective pixels are connected to an identical signal output line. In each effective pixel connected to the identical signal output line, the potential supply unit supplies a first potential from the reset transistor to the floating diffusion part. In each clipping pixel connected to the identical signal output line, the potential supply unit supplies a second potential different from the first potential from the reset transistor to the floating diffusion part. The analog-to-digital converter circuit includes a comparator configured to compare a value for the signal output line to which the analog signal is output and a value for a reference line, and a counter configured to count a time until comparison performed by the comparator is completed and hold a comparison result. The comparator includes an initialization unit configured to initialize, before the comparison is performed, an operating point of the comparator based on predetermined values for the signal output line and the reference line. A control unit configured to change the value for the reference line after initialization is provided. The method includes a step (a) of initializing the comparator; a step (b) of bringing, after the step (a), a selector transistor of at least one of the unit pixels into a non-conductive state; and a step (c) of changing, after the step (b), the value for the reference line.

According to the foregoing drive method, the blocked-up shadows can be reduced, and variation in pixels due to FPN can be reduced.

According to the solid-state imaging apparatus and the drive method of the present disclosure, the blocked-up shadows when high-brightness light enters the pixels can be reduced. This can be realized by using the dummy pixels without providing an additional scanning circuit for the clipping pixels. Thus, a circuit area can be reduced, or an increase in circuit area can be reduced. Further, variation in pixels due to FPN can be reduced and radically removed.

DETAILED DESCRIPTION

First Embodiment

A solid-state imaging apparatus of a first embodiment of the present disclosure and a method for driving the solid-state imaging apparatus will be described below with reference to drawings.

Figure 1:
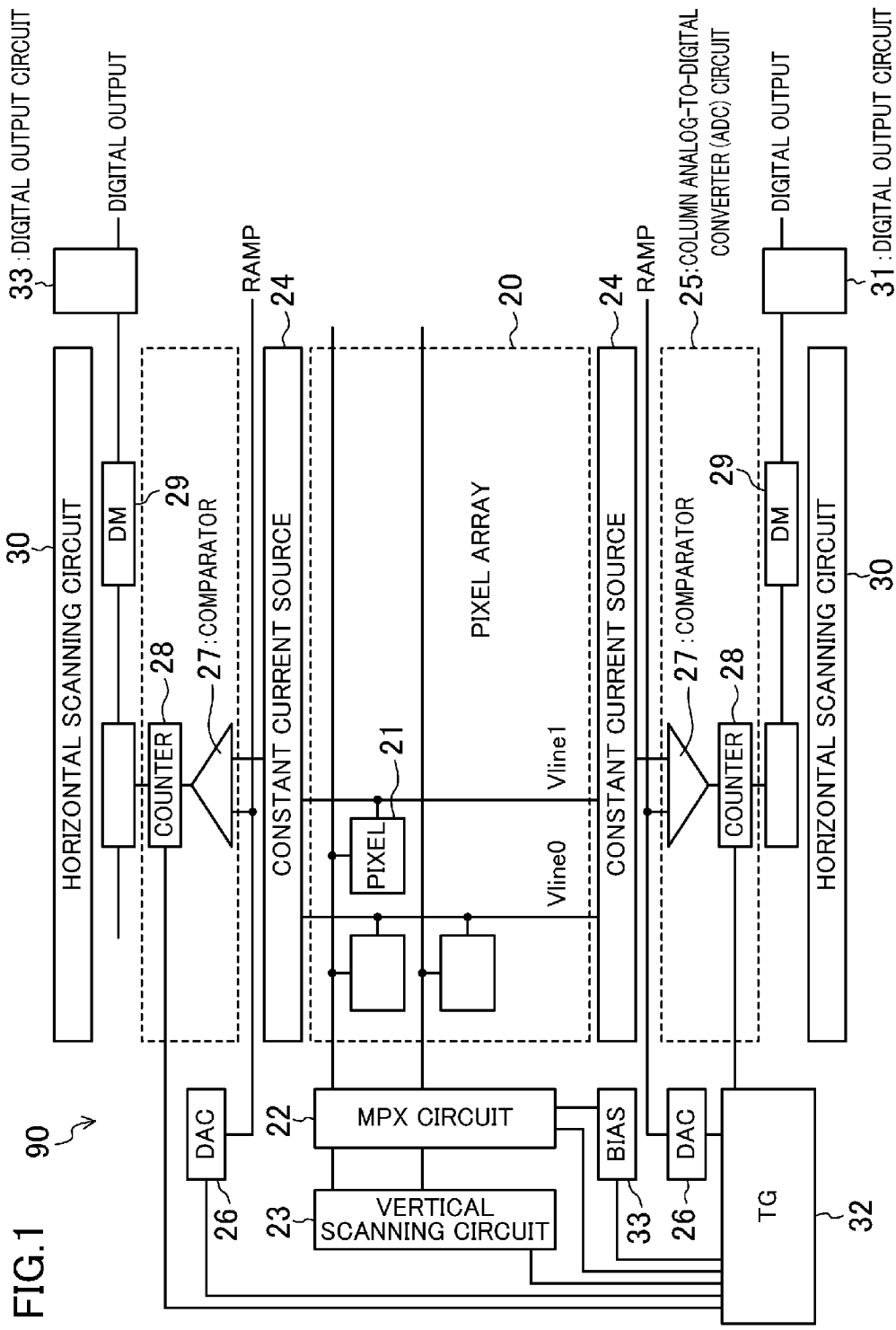
FIG. 1 is a configuration diagram illustrating an example solid-state imaging apparatus of a first embodiment of the present disclosure.

FIG. 1 is a configuration diagram of an example solid-state imaging apparatus 90 of the present embodiment. Note that, for the sake of simplified representation, only a small number of pixels, comparators, counters, etc. are illustrated.

Referring to FIG. 1, the solid-state imaging apparatus 90 includes a pixel array 20 formed such that a plurality of unit pixels 21 each including a photodiode configured to perform photoelectric conversion and a metal oxide semiconductor (MOS) transistor are arranged in a matrix. The solid-state imaging apparatus 90 further includes a multiplexer (MPX) circuit 22 configured to drive the pixel array 20, a vertical scanning circuit 23 configured to supply a row selection pulse to a selected row, a constant current source 24 connected to vertical signal lines Vline, and a column analog-to-digital converter (ADC) circuit 25 configured to receive a pixel signal. The vertical signal line Vline is provided for each column of the unit pixels 21, and reference numerals such as Vline0, Vline1, . . . are assigned respectively to the vertical signal lines Vline.

The ADC circuit 25 includes a comparator 27 configured to compare between a reference signal RAMP generated from a digital-to-analog converter (DAC) circuit 26 and an analog signal obtained from each unit pixel 21 through a corresponding one of the vertical signal lines Vline0, Vline1, . . . , and a counter 28 configured to count a comparison time.

The solid-state imaging apparatus 90 still further includes a digital memory (DM) 29 configured to hold data of the counter 28, a horizontal scanning circuit 30 configured to sequentially select pixel signals held at the DM 29, a digital output circuit 31 connected to the DM 29, and a timing generator (TG) circuit 32 configured to generate a pulse for operating each component.

The TG circuit 32 is configured to receive data from the outside and generate drive pulses corresponding to a plurality of drive modes.

Reference clip voltage Vddc and non-selected voltage Vddl are generated at a bias circuit 33, and are transferred to the pixel array 20 through the MPX circuit 22. Next, FIG. 2 is a plan view illustrating the configuration of the pixel array 20.

The pixel array 20 includes a light-irradiated pixel part 40 to be irradiated with light and a light-shielded pixel part 41 to be shielded from light by a light shielding film. In the light-irradiated pixel part 40, an effective pixel part 42 where pixel signals are used as video signals and a light-irradiated dummy pixel part 43a surrounding the effective pixel part 42 are provided. Moreover, in the light-shielded pixel part 41, an optical black (OB) pixel part 44 where signal charge of pixels is used as reference signals for black level and a light-shielded dummy pixel part 43b arranged at a position other than the OB pixel part 44 are provided.

Figure 2:
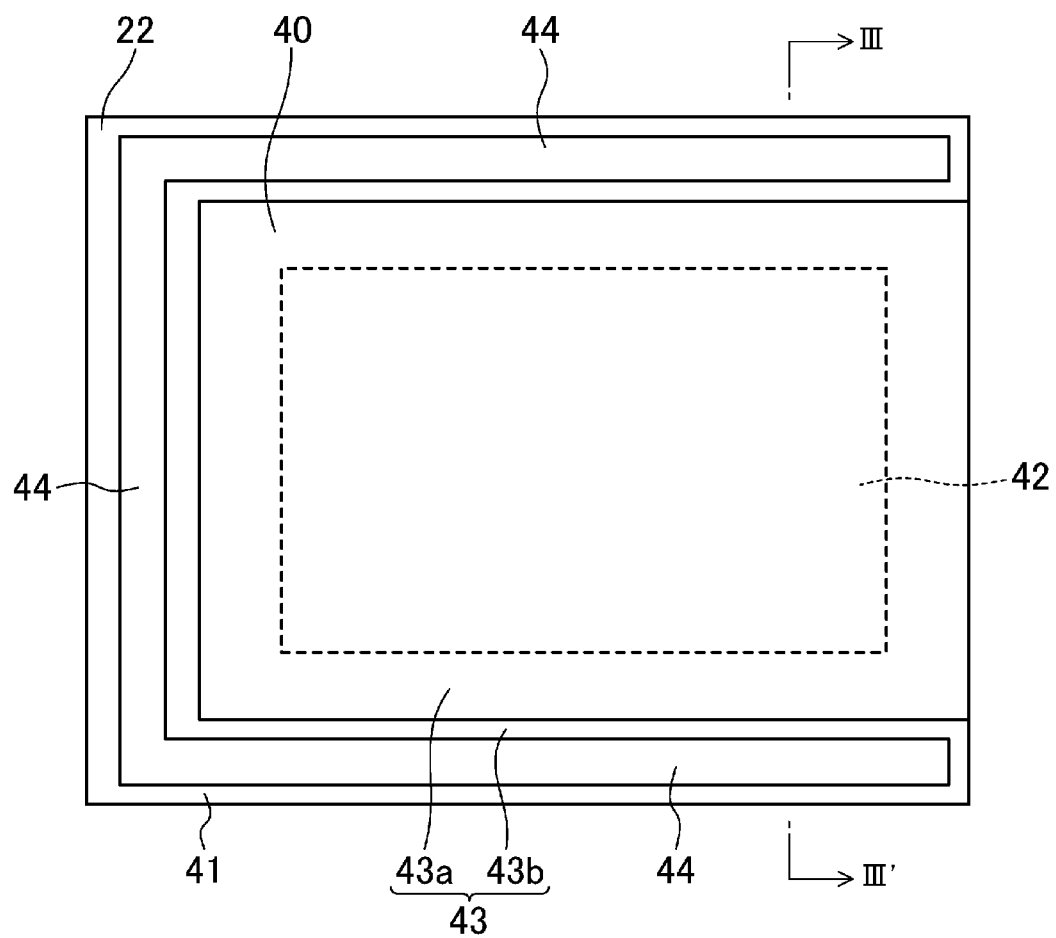
FIG. 2 is a plan view illustrating a configuration of a pixel array in the solid-state imaging apparatus illustrated in FIG. 1.
Figure 3:
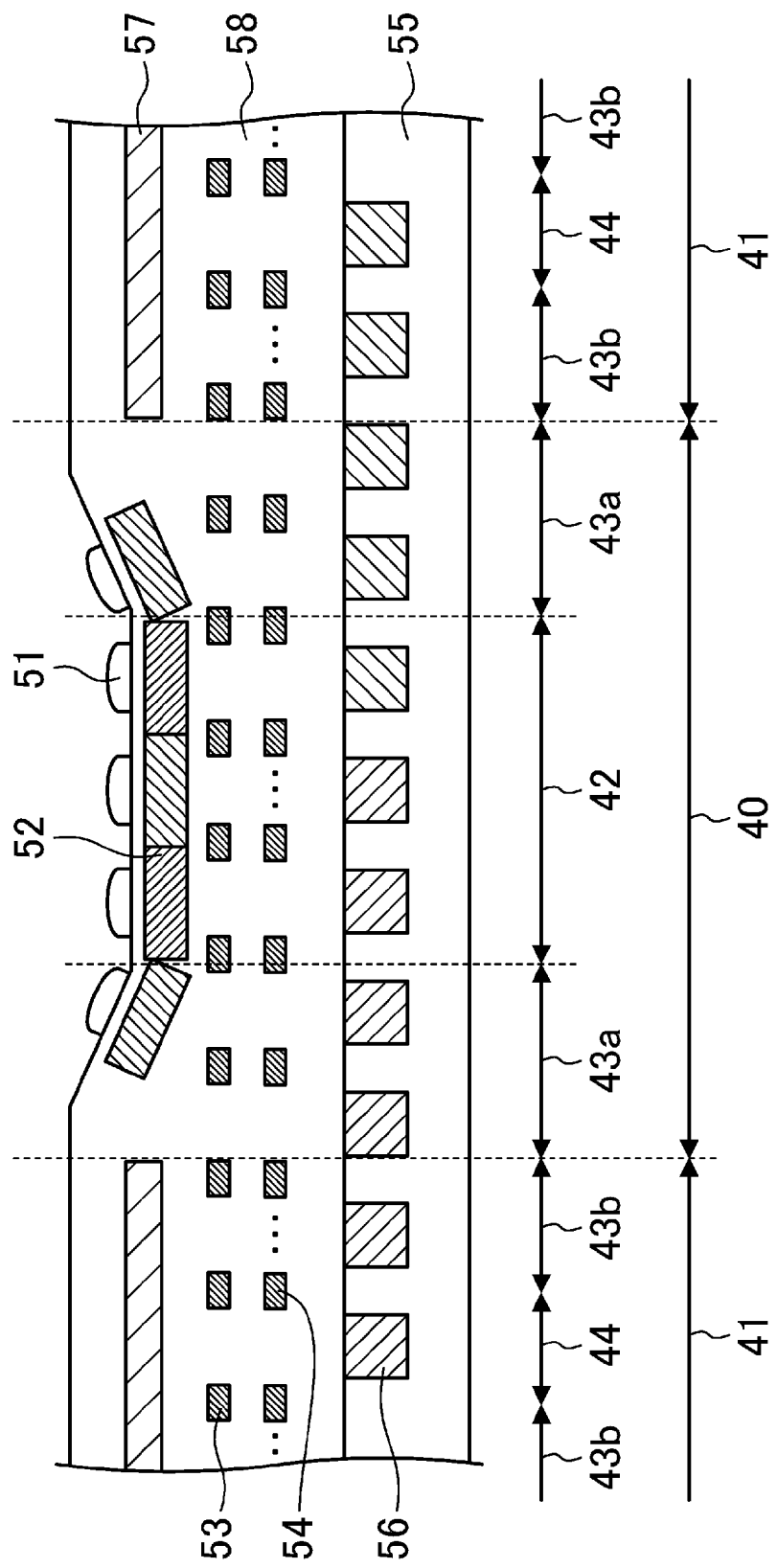
FIG. 3 is a cross-sectional view of the configuration of the pixel array in the solid-state imaging apparatus illustrated in FIG. 1, and corresponds to an III-III' line illustrated in FIG. 2.

Next, FIG. 3 is a cross-sectional view of the configuration of the pixel array 20 along an III-III' line illustrated in FIG. 2.

In the pixel array 20, a photodiode (PD) 56 configured to receive incident light and generate signal charge is, for each unit pixel, provided in an upper part of a substrate 55. An insulating layer 58 through which incident light passes, first metal wires 54 provided inside the insulating layer 58 to connect circuits of the pixel parts together, and second metal wires 53 provided inside the insulating layer 58 to connect the circuits of the pixel parts together and positioned above the first metal wires 54 are provided on the substrate 55. Microlenses 51 configured to allow light incidence into the PDs 56 such that light is collected to each of the PDs 56 and color filters 52 positioned below the microlenses 51 are further provided.

In the light-shielded pixel part 41, light shielding wires 57 configured to shield incident light are formed above the second metal wires 53.

The light shielding wires 57 form a step between the light-shielded pixel part 41 and the light-irradiated pixel part 40. Due to such a step, the region where the microlenses 51 and the color filters 52 are not formed parallel to the substrate 55 is formed so as to extend from a boundary between the light-irradiated pixel part 40 and the light-shielded pixel part 41 to an outer peripheral part of the light-irradiated pixel part 40. In such a region, the rate of light incidence to the PDs 56 changes, and therefore pixel signals vary depending on the effective pixel part 42. Thus, the foregoing region is configured as the light-irradiated dummy pixel part 43a. The light-irradiated dummy pixel part 43a is used as a buffer region where an influence of the step between the light-shielded pixel part 41 and the light-irradiated pixel part 40 is mitigated, and pixel signals from such a region are not used as video signals.

There is a case where the number of wiring layers is higher in part surrounding the light-irradiated pixel part 40 than in the light-irradiated pixel part 40, such as the case where two metal wiring layers are formed in the light-irradiated pixel part and three or more metal wiring layers are formed in part (e.g., a peripheral circuit configured to drive a pixel part of the MPX circuit 22) positioned outside the light-irradiated pixel part. In such a case, the buffer region is required in order to mitigate an influence of a step formed due to a difference in number of wiring layers, and therefore a dummy pixel part where pixel signals are not used as video signals is provided.

The light-shielded dummy pixel part 43b is arranged in an area extending from the boundary between the light-irradiated pixel part 40 and the light-shielded pixel part 41 to the OB pixel part 44 as a buffer region where entering of light into the OB pixel part 44 is reduced in the light-irradiated pixel part 40.

In order to use the region having layout continuity as the OB pixel part 44, the light-shielded dummy pixel part 43b is also arranged between an end of the pixel array 20 and the OB pixel part 44. Pixel signals from the light-shielded dummy pixel part 43b are not used as reference signals for black level.

As described above, the pixel array 20 includes the effective pixel part 42 irradiated with light and outputting pixel signals to be used as video signals, the OB pixel part 44 shielded from light and outputting pixel signals to be used as reference signals, the light-irradiated dummy pixel part 43a irradiated with light but outputting pixel signals which are not used as video signals, and the light-shielded dummy pixel part 43b shielded from light but outputting pixel signals which are not used as reference signals for black level.

Figure 4:
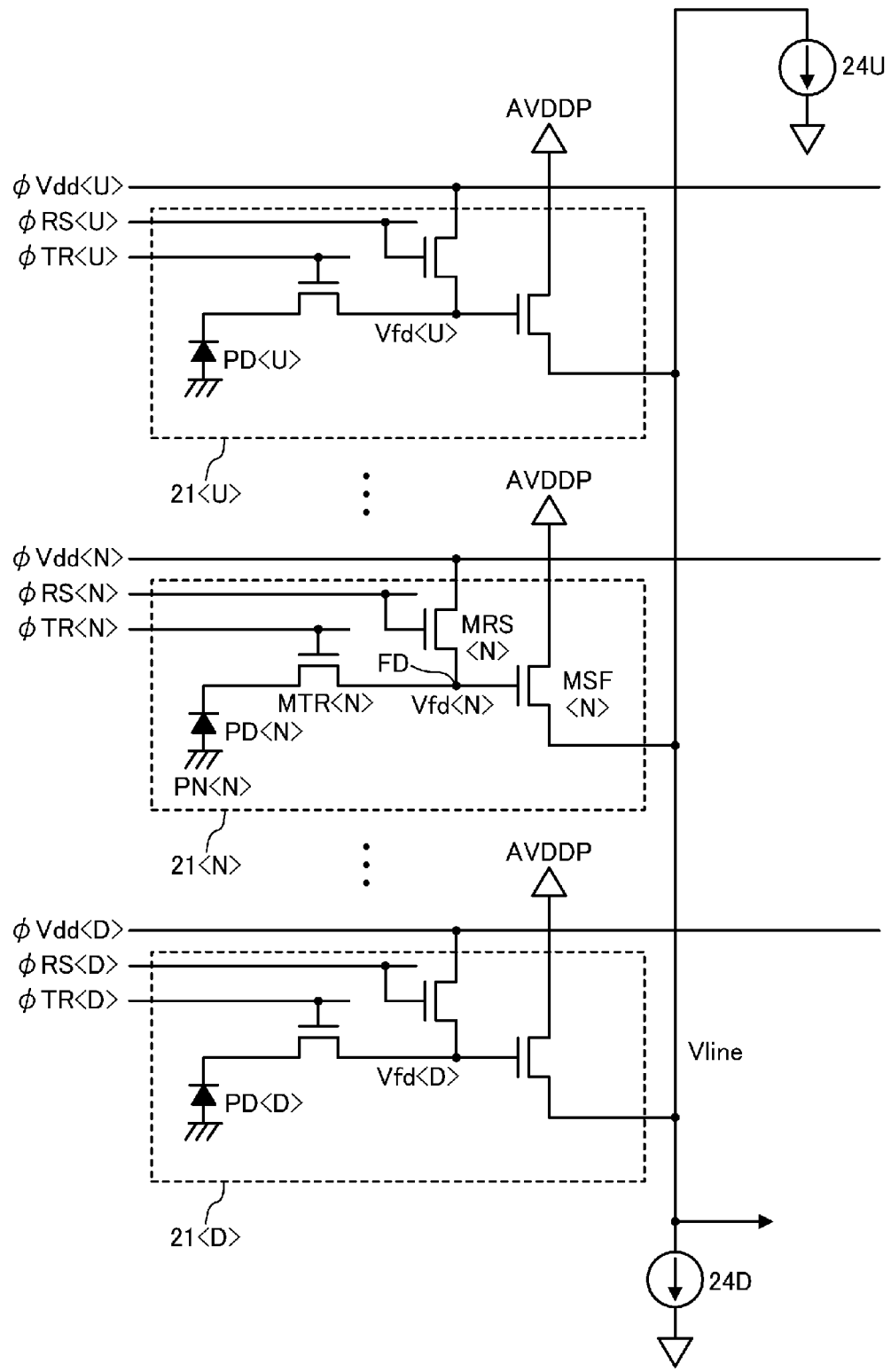
FIG. 4 is a configuration diagram illustrating the pixel array of the solid-state imaging apparatus illustrated in FIG. 1.

Next, FIG. 4 is a configuration diagram illustrating the pixel array 20.

Referring to FIG. 4, the unit pixel 21 forming the pixel array 20 has such a circuit configuration that, in addition to a photoelectric conversion element (e.g., a photodiode PD), a floating diffusion part FD (hereinafter also referred to as an "FD part") to which charge is transferred from the photodiode PD and three transistors of a transfer transistor MTR, a reset transistor MRS, and an amplifier transistor MSF are provided. The example where N-MOS transistors are used as the foregoing transistors will be described in the present embodiment. Note that other transistors such as P-MOS transistors may be also used.

The transfer transistor MTR is connected between a cathode electrode of the photodiode PD and the FD part, and is, at a transfer gate electrode thereof, connected to a transfer control line to which a transfer gate pulse φTR is applied.

The reset transistor MRS is, at a drain electrode thereof, connected to a bias line which is connected to each row of the pixel array 20 and through which a potential φVdd is transferred. Moreover, the reset transistor MRS is, at a source electrode thereof, connected to the FD part. Further, the reset transistor MRS is, at a gate electrode thereof, connected to a reset control line to which a reset pulse φRS is applied.

The amplifier transistor MSF is, at a gate electrode thereof, connected to the FD part. Moreover, the amplifier transistor MSF is, at a drain electrode thereof, connected to a pixel power source AVDDP. Further, the amplifier transistor MSF is, at a source electrode thereof, connected to the vertical signal line Vline.

The constant current sources 24 (24U and 24D) configured to supply constant current to the vertical signal line Vline and the comparator 27 are connected to the vertical signal line Vline.

Of the unit pixels 21, a unit pixel 21<N> is a unit pixel arranged in the effective pixel part 42 of the pixel array 20 and positioned at an Nth row, and is a pixel (reading pixel) from which an optical signal is read. A unit pixel 21<U> is a clipping pixel (i.e., a pixel for generating clip voltage) which is positioned in the light-irradiated dummy pixel part 43a or the light-shielded dummy pixel part 43b positioned on one side of the effective pixel part 42 and having plural rows of pixels and which is used for reducing or preventing blocked-up shadows. A unit pixel 21<D> is a clipping pixel (i.e., a pixel for generating clip voltage) which is positioned in the light-irradiated dummy pixel part 43a or the light-shielded dummy pixel part 43b positioned on the other side of the effective pixel part 42 and having plural rows of pixels and which is used for reducing or preventing the blocked-up shadows. Note that the clipping pixels (21<U> and 21<D>) are arranged so as to sandwich the effective pixel part 42 in a direction along the vertical signal line.

As described above, since the originally-provided pixels of the light-irradiated dummy pixel part 43a and the light-shielded dummy pixel part 43b are used as the clipping pixels, it is not necessary to provide additional pixels as the clipping pixels, and therefore an increase in chip area can be avoided.

The clipping pixel is positioned at a particular row. Thus, in order to constantly select the clipping pixel, connection to a row selection line extending from the vertical scanning circuit 23 is disconnected, and a required potential is input from the MPX circuit 22 to the clipping pixel such that a row selection signal state is maintained.

For example, if the state in which a row is selected is indicated by a high-level signal, the high-level signal is constantly input to the clipping pixel, and therefore the state in which the row is selected is maintained. This can be realized without increasing a circuit size.

Although the constant current sources 24 are provided respectively on upper and lower sides of the effective pixel part 42, the constant current sources 24 may be provided only on one side of the effective pixel part 42.

As in the foregoing, in the unit pixel 21, a single photodiode PD is provided for three transistors (i.e., the transfer transistor MTR, the reset transistor MRS, and the amplifier transistor MSF). However, in a single unit pixel, a plurality of photodiodes PD and a plurality of transfer transistors MTR may be provided.

Figure 5:
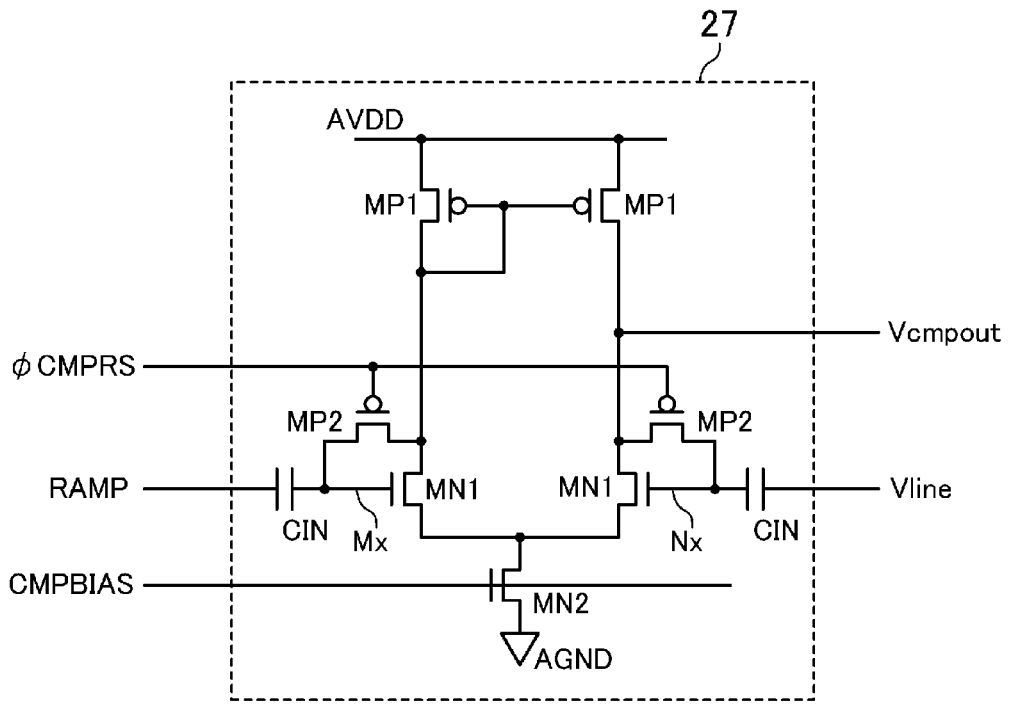
FIG. 5 is a diagram illustrating an example of a circuit of a comparator of the solid-state imaging apparatus illustrated in FIG. 1.

Next, FIG. 5 illustrates an example of a circuit of the comparator 27.

The comparator 27 includes a differential amplifier having a pair of N-transistors MN1 as inputs and formed by a pair of P-transistors MP1 and an N-transistor MN2 configured to have an arbitrarily-biased gate and to be operated at constant current, a pair of P-transistors MP2 to be switching transistors each configured to generate short circuit between drain and gate of the input N-transistor, and a pair of capacitors CIN each configured to cut off the DC level of the gate of the N-transistor MN1.

Each of the capacitors CIN is, at one end thereof, connected to the input N-transistor MN1 of the differential amplifier, and is, at the other end thereof, connected to the vertical signal line Vline to which a pixel signal of the unit pixel is output or a reference signal RAMP output from the DAC circuit 26. A node between the capacitor CIN connected to the vertical signal line Vline and the input N-transistor MN1 is a node Nx, and a node between the capacitor CIN connected to the reference signal RAMP and the input N-transistor MN1 is a node Mx.

Note that the input N-transistor MN1 may be, depending on an input value, formed by a P-transistor. Moreover, the configuration of the differential amplifier including an output thereof may be horizontally reversed.

Figure 6:
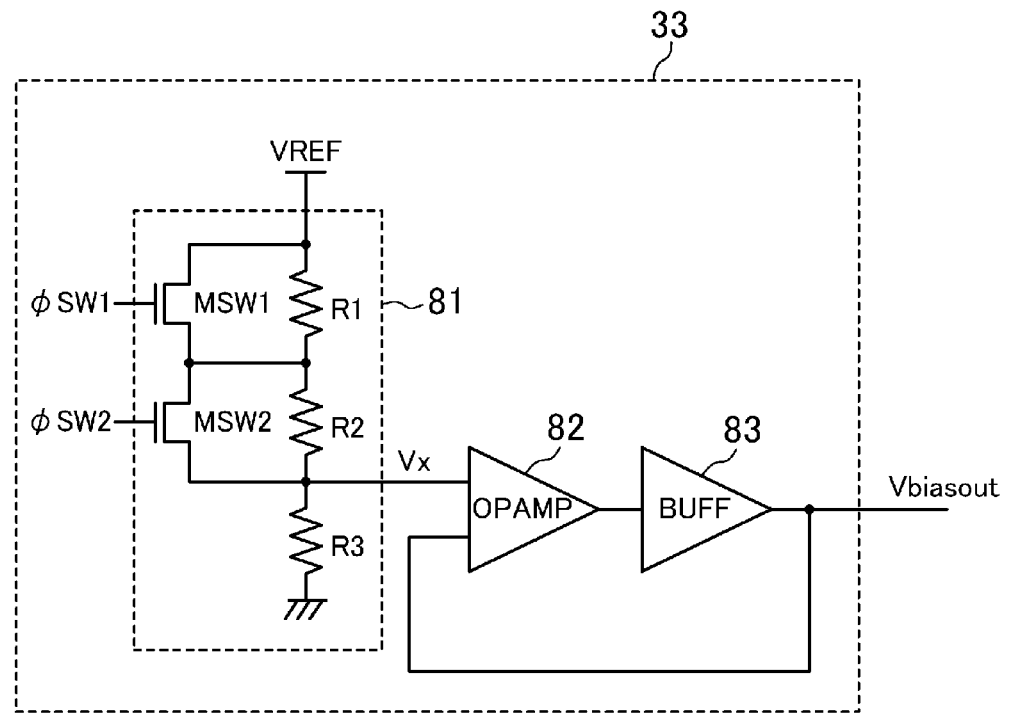
FIG. 6 is a diagram illustrating an example of a bias circuit of the solid-state imaging apparatus illustrated in FIG. 1.

Next, FIG. 6 illustrates an example of the bias circuit 33.

The bias circuit 33 includes a reference voltage generator circuit 81 configured to generate reference voltage Vx from reference voltage Vref, an operational amplifier (OPAMP) 82, and a BUFF circuit 83.

The reference voltage generator circuit 81 includes resistive elements R1, R2, R3 connected together in series and switching transistors MSW1, MSW2 connected in parallel respectively with the resistive elements R1, R2. Switching pulses φSW1, φSW2 which are control signals are input respectively to gates of the switching transistors MSW1, MSW2.

The reference voltage Vref is supplied to one end of the resistive element R1, and one end of the resistive element R3 is connected to GND.

Voltage Vx at a node which is a connection part between the resistive elements R2, R3 connected together in series is input to the OPAMP 82 as reference voltage. An output of the OPAMP 82 at one end thereof is connected to an input of the BUFF circuit 83 configured to amplify a signal, and bias voltage Vbiasout is output through an output line connected to the BUFF circuit 83. An input of the OPAMP 82 at the other end thereof is connected to the output line, and the bias voltage Vbiasout is input to the OPAMP 82.

When the gain of the OPAMP 82 is Aop, [Vbiasout=Aop×(Vx−Vbiasout)] is satisfied. If the gain Aop is sufficiently large, the voltage Vx is output as the bias voltage Vbiasout.

Note that the number of resistive elements connected together in series and the number of switching transistors MSW may be increased to increase a set value. Moreover, the switching pulses φSW1, φSW2 to be input respectively to the switching transistors MSW1, MSW2 may be DC. Further, the bias value Vbiasout may be changed in such a manner that the switching pulses φSW1, φSW2 are switched between high and low levels at predetermined timing and then are output.

(Method for Driving Solid-State Imaging Apparatus)

The method for driving the solid-state imaging apparatus 90 particularly in a blocked-up shadow reduction operation will be described below.

Figure 7:
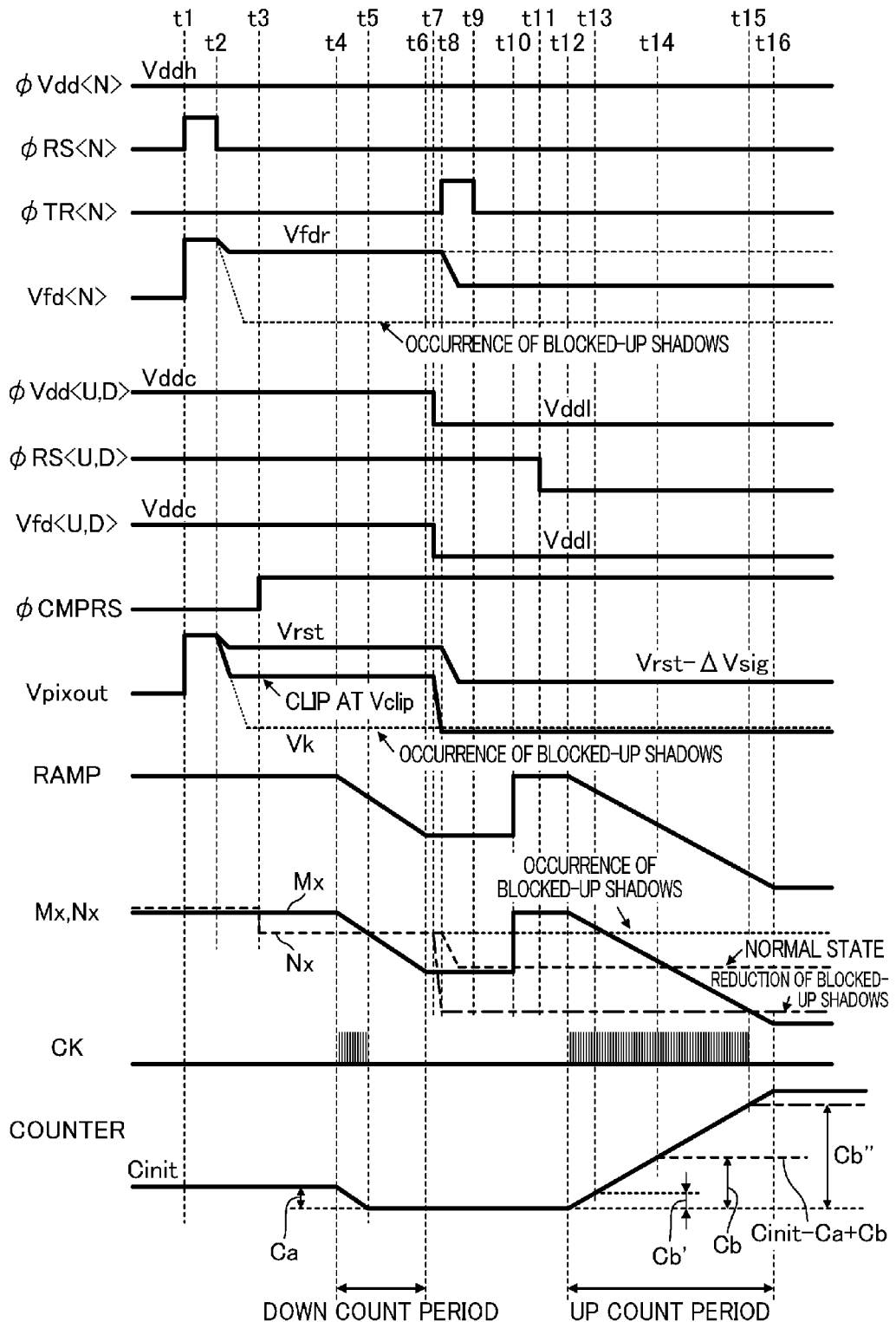
FIG. 7 is a chart illustrating an example of drive timing in order to describe a blocked-up shadow reduction operation in the solid-state imaging apparatus illustrated in FIG. 1.

FIG. 7 is a chart illustrating an example of drive timing when the blocked-up shadow reduction operation is performed in the solid-state imaging apparatus 90.

Referring to FIG. 7, at time t1, a reset pulse φRS<N> of the reading pixel 21<N> is changed to the high level, and voltage Vfd<N> is changed to Vddh at the FD part of the reading pixel 21<N> to increase the potential Vpixout of the vertical signal line Vline.

In such a state, the clipping pixels 21<U>, 21<D> (hereinafter collectively referred to as a "clipping pixel(s) 21<U, D>") have a reset pulse φRS<U, D> which is at the high level, and a power supply pulse φVdd<U, D> is obtained from the reference clip voltage Vddc (i.e., voltage higher than the non-selected voltage Vddl). Thus, the potential Vfd<U, D> is at the reference clip voltage Vddc at the FD part of the clipping pixel 21<U, D>.

In the comparator 27, a reset pulse φCMPRS input to gates of the switching transistors MP2 each configured to generate short circuit between the gate and drain of the N-transistor MN1 is at the low level, resulting in short circuit. That is, the comparator 27 is in a reset state.

The reference signal RAMP is reset to an initial value. A clock CK to be input to the counter is fixed at the low level.

A count value is set at an initial value Cinit. The potential Vfd<K> of the FD parts of the pixels which are not shown in the figure is maintained at the non-selected voltage Vddl (as described above, Vddl<Vddc), and an amplifier transistor MSF<K> is turned OFF.

The state in which light enters such that the blocked-up shadows do not occur (or no light enters) is hereinafter referred to as a "normal state."

At time t2, the reset pulse φRS<N> is changed to the low level.

At this point, in the normal state, a difference in potential of the FD part is caused due to noise caused by switching of the reset transistor MRS. That is, the voltage Vfd<N> is changed to Vfdr as indicated by a solid line, and the potential Vpixout of the vertical signal line Vline is changed to Vrst.

On the other hand, if high-brightness light causing the blocked-up shadows enters, a pixel signal may leak from the photodiode PD, and may be transferred to the FD part. As a result, the potential of the voltage Vfd<N> drops as indicated by a dashed line. In such a state, if there is no clipping pixel 21<U, D>, the potential Vpixout of the vertical signal line Vline drops to a vertical signal line potential Vk determined depending on the other unit pixels 21<K> which are not shown in the figure. However, in the case of the solid-state imaging apparatus 90, the clipping pixels 21<U, D> are provided. Thus, depending on the reference clip voltage Vddc and the number of clipping pixels, the potential Vpixout of the vertical signal line Vline is clipped at Vclip which is higher than the vertical signal line potential Vk.

At time t3, the reset pulse φCMPRS of the comparator 27 is changed to the high level, and therefore the reset state of the comparator 27 is cleared. With clearing of the reset state, a difference in potential between the node Mx and the node Nx is caused due to, e.g., occurrence of offset by switching of the transistors MP2 of the comparator 27 (the potential of the node Mx is indicated by a solid line, and the potential of the node Nx is indicated by a dashed line. For the potential of the node Nx, each of the normal state, a blocked-up shadow generation state, a blocked-up shadow reduction state is illustrated). Note that the foregoing difference may be intentionally generated such that the potential of the node Nx is lower, and a down count value Ca is determined depending on the foregoing difference.

At time t4, the potential of the reference signal RAMP begins decreasing with a certain slope. With such a decrease, the potential of the node Mx (i.e., the node positioned on a side close to the capacitor CIN and connected to the reference signal RAMP) also begins decreasing. At the same time, a CK pulse is input to the clock CK to be input to the counter 28.

At time t5, the potential of the node Nx (i.e., the node positioned on the side close to the capacitor CIN and connected to the vertical signal line Vline) and the potential of the node Mx become equal to each other. In such a state, the output of the comparator 27 is inverted, and, at the same time, a count value [Cinit−Ca] corresponding to a comparison period is held at the counter. Count from time t4 to time t5 is down count.

At time t6, the decrease in potential of the reference signal RAMP (i.e., the decrease with the certain slope) is stopped.

At time t7, the power supply pulse φVdd<U, D> drops from the pulse of the reference clip voltage Vddc to the pulse of the non-selected voltage Vddl. Thus, the voltage of the FD part of the clipping pixel 21<U, D> also drops from the reference clip voltage Vddc to the non-selected voltage Vddl. The potential Vpixout of the vertical signal line Vline is substantially equal to the vertical signal line potential Vk determined depending on the other pixel 21<K>.

At this point, since the potential Vpixout of the vertical signal line Vline is determined depending on the reading pixel 21<N>, the potential Vpixout of the vertical signal line Vline is maintained at Vrst regardless of the decrease in potential at the FD part of the clipping pixel 21<U, D>. The potential of the node Nx is not changed, neither.

If high-brightness light causing the blocked-up shadows enters the reading pixel 21<N> and the clipping pixels 21<U, D> are provided, the potential Vpixout of the vertical signal line Vline is determined depending on the clipping pixels 21<U, D>. Thus, the potential Vpixout drops in accordance with the decrease in potential at the FD part of the clipping pixel 21<U, D>. Accordingly, the potential of the node Nx also drops at time t7.

If high-brightness light causing the blocked-up shadows enters the reading pixel 21<N> and no clipping pixel 21<U, D> is provided, the potential Vpixout of the vertical signal line Vline is not changed from the vertical signal line potential Vk which has already dropped. The potential of the node Nx is not changed, neither.

At time t8, a transfer pulse φTR<N> of the reading pixel 21<N> is changed to the high level, and signal charge is transferred from the photodiode PD to the FD part through a transfer transistor MTR<N>.

In the normal state, the potential at the FD part of the reading pixel 21<N> drops by a pixel signal. Accordingly, the potential Vpixout of the vertical signal line Vline and the potential of the node Nx drop.

If high-brightness light causing the blocked-up shadows enters the reading pixel 21<N>, charge leaking from the photodiode PD has already transferred to the FD part. Thus, even if the transfer pulse φTR<N> is changed to the high level, the voltage Vfd<N> is not changed from the potential which has already dropped. Thus, upon both of blocked-up shadow occurrence and blocked-up shadow reduction, the potential of the node Nx is not changed.

At time t9, the transfer pulse φTR<N> of the reading pixel 21<N> is changed from the high level to the low level, and the transfer transistor MTR<N> is tuned OFF.

At time t10, the reference signal RAMP is reset to the initial value. Thus, the potential of the node Mx is also changed back to an initial value.

At time t11, the reset pulse φRS<U, D> of the clipping pixel 21<U, D> is changed from the high level to the low level.

At time t12, the reference signal RAMP begins decreasing with a certain slope. Accordingly, the potential of the node Mx also begins decreasing. At the same time, the CK pulse is input to the clock CK to be input to the counter 28.

Subsequently, the output of the comparator 27 is inverted at the time at which the potential of the node Mx and the potential of the node Nx become equal to each other, and, at the same time, the count value corresponding to the comparison period is held at the counter. Note that count is up count. Thus, at the counter, a difference between up count after time t12 and down count from time t4 to time t5 is automatically held.

In the normal state, the potential Vpixout of the vertical signal line Vline drops by a pixel signal of the reading pixel 21<N>, and the potential of the node Nx also drops. Thus, the comparison period upon up count is extended depending on the amount of decrease in potential, and the output of the comparator 27 is inverted at time t14. Since a count value Cb corresponding to the comparison period is added to the counter, [Cinit−Ca+Cb] obtained based on the initial value Cinit, the down count value Ca, and the up count value Cb is held at the counter.

If high-brightness light causing the blocked-up shadows enters the reading pixel 21<N> and no clipping pixel 21<U, D> is provided, the potential Vpixout of the vertical signal line Vline is not changed from the vertical signal line potential Vk from clearing of the reset state of the comparator 27 (i.e., time t3) to an up count period through a down count period. Thus, since the potential of the node Nx is not changed, an up count value Cb' becomes substantially equal to the down count value Ca at time t13 at which the potential of the node Mx and the potential of the node Nx become equal to each other. As a result, the initial value Cinit which is substantially equal to a dark level is held as a counter value at the counter.

If high-brightness light causing the blocked-up shadows enters the reading pixel 21<N> and the clipping pixels 21<U, D> are provided as in the present embodiment, the following state is brought about. That is, after the down count period, the comparison period is extended by such an amount that the potential Vpixout of the vertical signal line Vline (and the potential of the node Nx) drops due to a change in potential of the FD part of the clipping pixel 21<U, D> (i.e., by the amount corresponding to [Vclip−Vk]). Thus, the potential of the node Mx and the potential of the node Nx become equal to each other when time t=15. At this point, the output of the comparator 27 is inverted, and [Cinit−Ca+Cb"] is held as the count value corresponding to the comparison period at the counter.

Even if high-brightness light enters, it is necessary, in order to reduce the blocked-up shadows, that the obtained change amount ([Vclip−Vk]) of the potential of the FD part is larger than a saturation signal which is the maximum signal which can be stored in the photodiode PD.

When gate/source voltage of an amplifier transistor MSF<U, D> of the clipping pixel 21<U, D> is Vgs_clip, the clip potential for the potential Vpixout of the vertical signal line Vline is [Vclip=Vddc−Vgs_clip]. Thus, in order to reduce the blocked-up shadows, it is necessary to increase the reference clip voltage Vddc to some extent.

Next, at time t16, the decrease in potential of the reference signal RAMP with the certain slope is stopped, and the up count period ends.

As in the foregoing, even if high-brightness light causing the blocked-up shadows enters the reading pixel 21<N>, the blocked-up shadows can be reduced by the clipping pixels 21<U, D>. Note that such a configuration comes with restriction of the reference clip voltage Vddc.

Note that blocked-up shadow reduction based on the timing chart illustrated in FIG. 7 is applicable to a solid-state imaging apparatus which does not include the ADC circuit 25.

(FPN Reduction in Pixel)

As described above, it is necessary to increase the reference clip voltage Vddc to some extent. However, a higher reference clip voltage Vddc with respect to the potential Vpixout of the vertical signal line Vline results in more occurrence of FPN of the pixel due to leakage current of the clipping pixel 21<U, D>.

Figure 8:
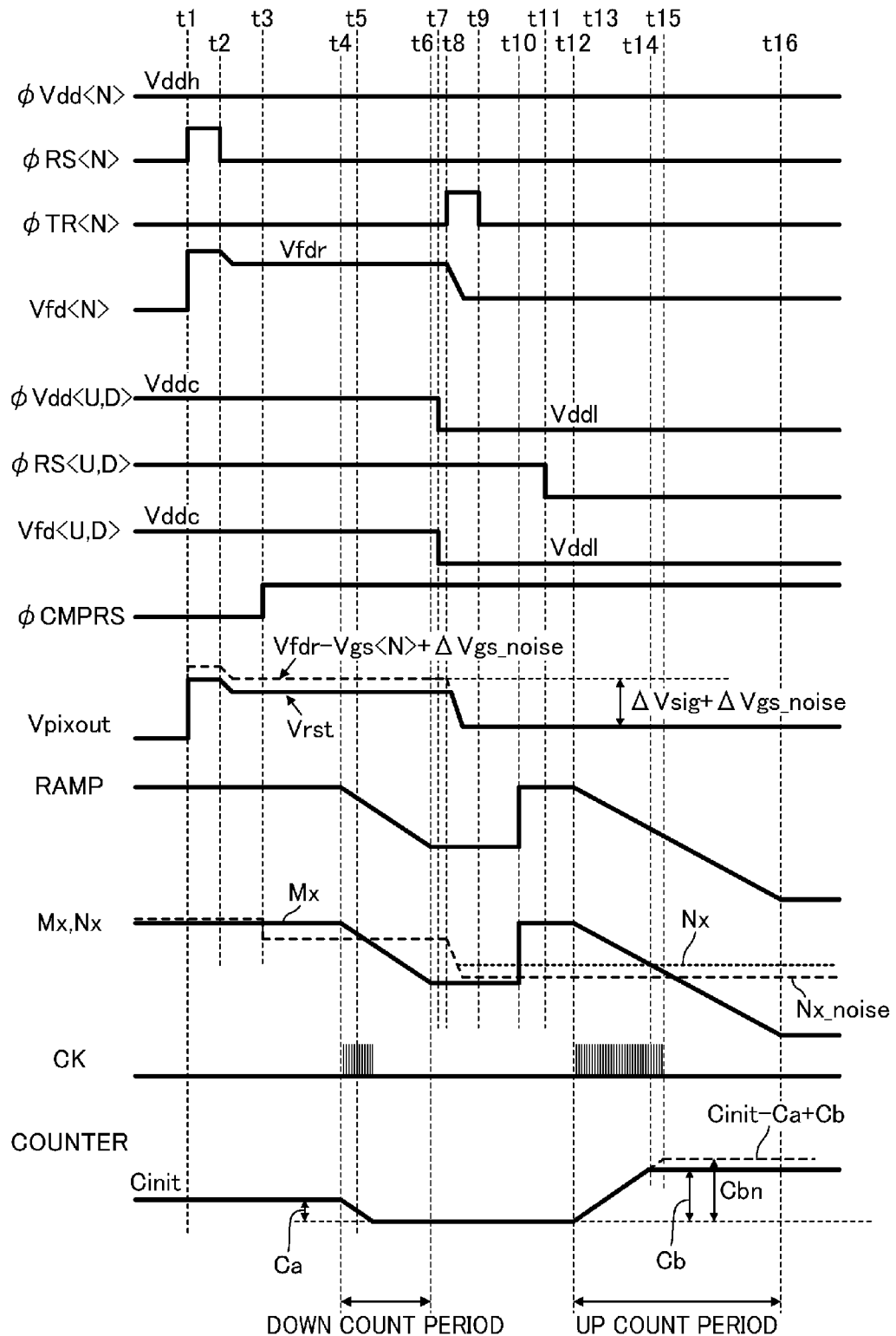
FIG. 8 is a chart illustrating an example of drive timing in order to describe an operation for reducing variation in pixels due to FPN in the solid-state imaging apparatus illustrated in FIG. 1.

FIG. 8 illustrates, in order to describe an operation when the variation in pixel due to FPN occurs, an example of drive timing in the case where the ADC circuit 25 is provided. Differences from the drive timing illustrated in FIG. 7 will be mainly described.

At time t2 in FIG. 8, the reset pulse φRS<N> is changed to the low level. Since the reset pulse φRS<U, D> is at the high level, the potential Vfd<U, D> is the reference clip voltage Vddc at the clipping pixel 21<U, D>. If leakage current 1_leak is generated at the amplifier transistor MSF<U, D> of the clipping pixel 21<U, D>, current flowing through an amplifier transistor MSF<N> of the reading pixel 21<N> drops by the leakage current 1_leak. That is, the current is [ISF−1_leak].

Suppose that the amount of decrease in gate/source voltage Vgs due to the leakage current is ΔVgs_noise. The potential Vpixout of the vertical signal line Vline is [Vfdr−Vgs<N>+ΔVgs_noise]. In FIG. 8, the potential Vpixout including ΔVgs_noise is indicated by a dashed line, and the potential Vpixout excluding ΔVgs_noise is indicated by a solid line. Moreover, for the potential of the node Nx, the case (Nx_noise) with concerning an noise influence and the case (Nx) without concerning the noise influence are illustrated.

At time t4, the down count period begins, and the potential of the node Mx and the potential of the node Nx are compared to each other in the comparator 27. At this point, since the reference clip voltage Vddc is applied to the clipping pixel 21<U, D>, the leakage current 1_leak is generated, and the potential Vpixout of the vertical signal line Vline is [Vfdr−Vgs<N>+ΔVgs_noise].

At time t5, the potential of the node Mx and the potential of the node Nx become equal to each other, and the output of the comparator 27 is inverted. Moreover, the count value Ca corresponding to the comparison period is set at the counter 28. Note that the down count period ends at time t6.

At time t7, a power supply potential Vdd<U, D> applied to the clipping pixel 21<U, D> drops from the reference clip voltage Vddc to the non-selected voltage Vddl. In such a state, the leakage current 1_leak varies in an exponential manner depending on gate voltage. Thus, the leakage current 1_leak flowing through the amplifier transistor MSF<U, D> of the clipping pixel 21<U,D> drops so that the leakage current 1_leak can be ignored. As a result, the potential Vpixout of the vertical signal line Vline at this point is [Vfdr−Vgs<N>].

At time t8, the transfer pulse φTR<N> is changed to the high level in order to read signal charge from the photodiode PD of the reading pixel 21<N>.

At time t9, the transfer pulse φTR<N> is changed to the low level. The potential of the voltage Vfd<N> is [Vfdr−ΔVsig] depending on the amount of charge of the photodiode PD. Depending on such a change, the potential Vpixout of the vertical signal line Vline is [Vfdr−Vgs<N>−ΔVsig].

At time t13, the up count period begins, and the potential of the node Mx and the potential of the node Nx are compared to each other in the comparator 27. In the case without concerning the influence of ΔVgs_noise, the foregoing two potentials become equal to each other at time t14, and the up count value Cb is stored at the counter 28. On the other hand, in the case of the potential (Nx_noise) of the node Nx including ΔVgs_noise, the foregoing two potentials become equal to each other at time t15, and an up count value Cbn is stored at the counter 28. As in the case where no ADC circuit 25 is provided, the noise ΔVgs_noise due to the clipping pixels are detected based on the foregoing difference.

As in the foregoing, FPN of the pixel occurs. Since the leakage current 1_leak when the reference clip voltage Vddc is applied to the clipping pixel 21<U, D> causes FPN of the pixel, the leakage current 1_leak may be reduced in order to reduce occurrence of FPN of the pixel.

However, if the reference clip voltage Vddc applied to the FD part of the clipping pixel 21<U, D> is lowered, the clip potential Vclip (Vddc−Vgs_clip) of the vertical signal line Vline drops upon occurrence of the blocked-up shadows, and a signal output [Vclip−Vk] from the clipping pixel 21<U, D> is also reduced. As in the foregoing, it is necessary that the signal output [Vclip−Vk] is equal to or greater than the saturation signal of the pixel, and therefore the reference clip voltage Vddc can be decreased only to some extent.

When high-brightness light causing the blocked-up shadows enters the reading pixel 21<N>, the clip potential of the clipping pixel 21<U, D> for the vertical signal line Vline is Vclip, and the clip potential Vclip is represented by [Vddc−Vgs_clip]. Thus, in order to increase the clip potential Vclip of the vertical signal line Vline, the gate/source voltage Vgs_clip may be decreased.

The amplifier transistor MSF of each pixel part is operated as a source follower. Suppose that the gate/source voltage of the amplifier transistor MSF is Vgs, current flowing from the drain to the source of the amplifier transistor MSF is Ids, a threshold value is Vth, the width of a channel of the amplifier transistor is W, the length of the channel of the amplifier transistor is L, and a proportionality coefficient is β0. The gate/source voltage is represented by $[Vgs=(Ids/(2*\beta 0*W/L))^{0.5}+Vth]$.

Thus, in order to decrease the gate/source voltage Vgs_clip, the current amount Ids per clipping pixel 21<U, D> may be decreased in such a manner that a plurality of clipping pixels 21<U, D> are operated in parallel. Moreover, in order to extend a set range of the reference clip voltage Vddc, it is effective that a plurality of clipping pixels 21<U, D> are provided.

A signal output from the clipping pixel 21<U, D> upon blocked-up shadow reduction is represented by [Vclip−Vk]. By substitution of Vclip and Vk, the signal output is represented by [(Vddc−Vgs_clip)−(Vddl−Vgs_clip')]. Note that Vgs_clip' represents the gate/source voltage in the other pixel 21<K> different from the reading pixel 21<N> and the amplifier transistor MSF of the clipping pixel 21<U, D>.

If the reference clip voltage Vddc and the non-selected voltage Vddl are generated from the bias circuit illustrated in FIG. 6 by using the same reference voltage Vref, the reference clip voltage Vddc and the non-selected voltage Vddl change in the same direction even if the reference voltage Vref varies. Thus, a signal output from the clipping pixel 21<U, D> does no change upon blocked-up shadow reduction. That is, the signal output is not reduced, and the configuration which is not susceptible to the change in reference voltage Vref can be realized. Thus, the set range of the reference clip voltage Vddc can be determined without concerning variation in reference voltage Vref, and therefore this can be a technique for expending the set range.

Since the constant current sources 24 (24U and 24D) are arranged on the upper and lower sides of the pixel array 20 (such a configuration is not essential), a voltage drop due to wiring resistance of the vertical signal line Vline from the reading pixel 21<N> to the clipping pixel 21<U, D> can be reduced. Thus, occurrence of FPN of the pixel can be reduced as follows.

The leakage current 1_leak of the clipping pixel 21<U, D> increases with increasing the gate/source voltage of the amplifier transistor MSF<U, D> of the clipping pixel 21<U, D>. Thus, a decrease in source potential of the amplifier transistor MSF<U, D> of the clipping pixel is reduced depending on the position of the reading pixel. As a result, the dependency of the leakage current of the clipping pixel on the position of the reading pixel is reduced, and therefore occurrence of FPN of the pixel can be reduced.

In the case where the comparators 27 are provided on the upper and lower sides as illustrated in FIG. 1, it is preferred that the clipping pixels 21<U, D> are arranged respectively on the upper and lower sides of the effective pixel part 42. Such arrangement allows reduction in variation (e.g., the foregoing voltage drop) due to the positional relationship among the reading pixel 21<N> and the clipping pixels 21<U, D>.

Even upon driving in which reading is simultaneously performed for two or more reading pixels 21<N> and signal charge is mixed at the vertical signal line Vline, the blocked-up shadows can be reduced by the foregoing drive method.

(Variation)

Figure 9:
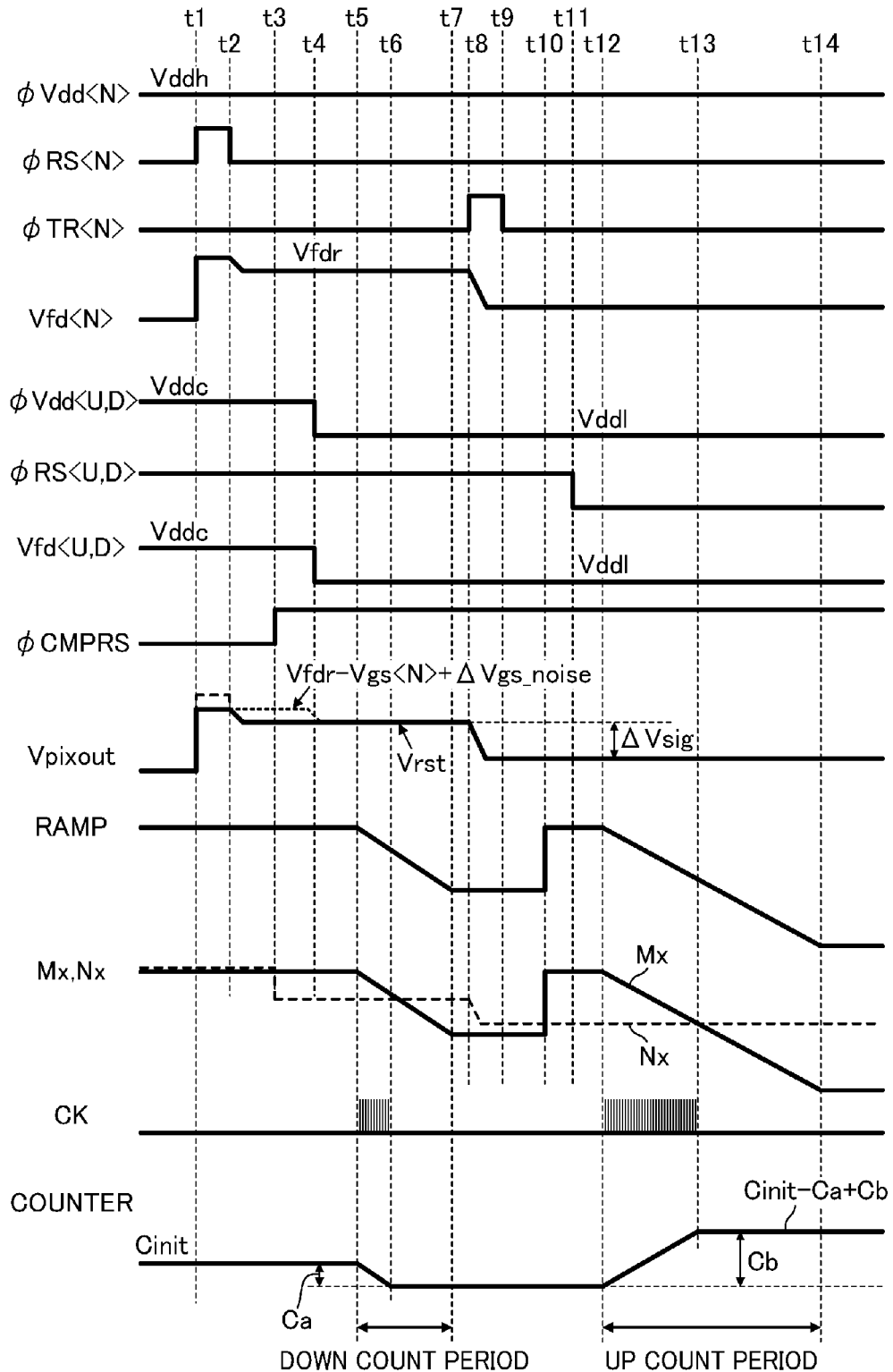
FIG. 9 is a chart illustrating an example of drive timing in order to describe an operation for removing variation in pixels due to FPN in the solid-state imaging apparatus illustrated in FIG. 1.

The method for reducing occurrence of FPN of the pixel by using the clipping pixels 21<U, D> has been described above. On the other hand, FIG. 9 illustrates an example of drive timing in order to describe an operation for radically removing variation in pixels due to FPN in the example solid-state imaging apparatus 90. Note that differences from the foregoing drive timing illustrated in FIG. 8 will be mainly described.

At time t3, the reset pulse φCMPRS of the comparator 27 is changed to the high level, and the reset state of the comparator 27 is cleared.

Subsequently, at time t4, the power supply pulse φVdd<U, D> applied to the clipping pixel 21<U, D> drops from the pulse of the reference clip voltage Vddc to the pulse of the non-selected voltage Vddl. At this point, since no influence of the leakage current 1_leak of the clipping pixel 21<U, D> is provided, the potential Vpixout of the vertical signal line Vline is [Vfdr−Vgs<N>].

At time t5, the down count period begins, and the count value Ca corresponding to the potential Vpixout of the vertical signal line Vline in the state in which no influence of the leakage current of the clipping pixel 21<U, D> is provided is held at the counter 28.

At time t8, the transfer pulse φTR<N> is changed to the high level in order to read signal charge from the photodiode PD of the reading pixel 21<N>.

At time t9, the transfer pulse φTR<N> is changed to the low level, and the voltage Vfd<N> is [Vfdr−Δsig] depending on the amount of charge of the photodiode PD. Depending on such a change, the potential Vpixout of the vertical signal line Vline is [Vfdr−Vgs<N>−ΔVsig].

At time t12, the up count period begins, and the potential of the node Mx and the potential of the node Nx are compared to each other by the comparator 27. At this point, the count value Cb corresponding to the potential Vpixout of the vertical signal line Vline is added to the counter 28, and, as a result, a count value [Clint−Ca+Cb] corresponding to ΔVsig is held at the counter 28.

As in the foregoing, the count value which does not include the noise ΔVgs_noise due to the clipping pixels 21<U, D> can be obtained. That is, FPN of the pixel can be removed.

Figure 10:
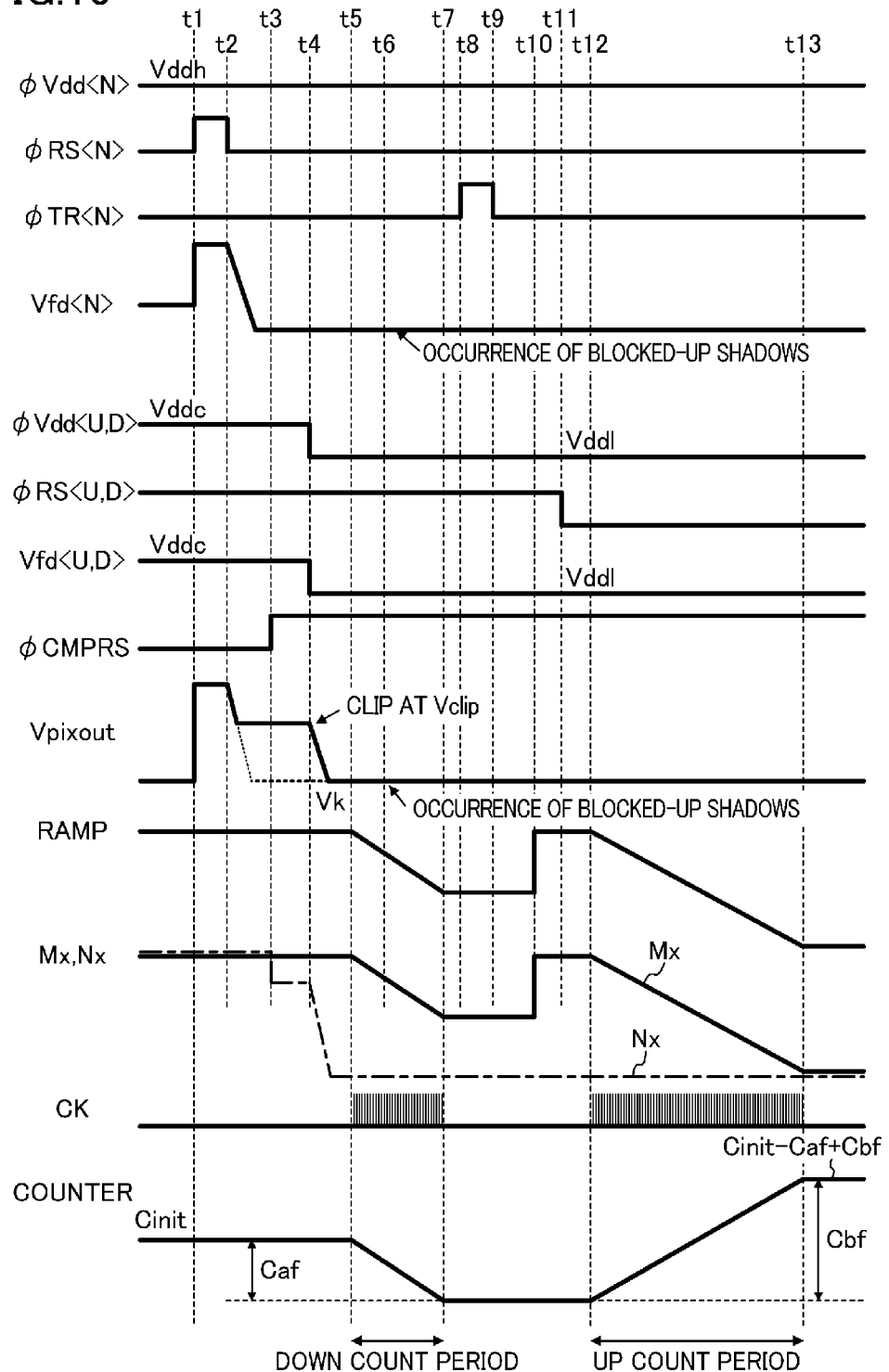
FIG. 10 is a chart illustrating an example of drive timing in order to describe a blocked-up shadow reduction operation when an operation for removing variation in pixels due to FPN in the solid-state imaging apparatus illustrated in FIG. 1 is performed.

Next, FIG. 10 illustrates, in association with the drive timing illustrated in FIG. 9, an example of drive timing in order to describe the blocked-up shadow reduction operation when high-brightness light causing the blocked-up shadows enters the reading pixel 21<N>. Note that differences from the foregoing drive timing illustrated in FIG. 9 will be mainly described.

At time t2, the reset pulse φRS<N> is changed to the low level. At this point, if high-brightness light enters the reading pixel 21<N>, a pixel signal leaks from the photodiode PD, and is transferred to the FD part. As a result, the potential drops as indicated by the voltage Vfd<N>.

If no clipping pixel 21<U,D> is provided, the potential Vpixout of the vertical signal line Vline drops to the vertical signal line potential Vk determined depending on the not-shown pixel 21<K>. On the other hand, since the clipping pixels 21<U, D> are provided in the present embodiment, the potential Vpixout of the vertical signal line Vline is, depending on the reference clip voltage Vddc and the number of clipping pixels 21<U, D>, clipped at the clip potential Vclip higher than the vertical signal line potential Vk.

At time t3, the reset pulse φCMPRS of the comparator 27 is changed to the high level, and the reset state of the comparator 27 is cleared. At this point, in the comparator 27, an operating point (i.e., the point at which inversion occurs) is determined based on the initial value of the reference signal RAMP, the state of the potential Vpixout (=Vclip) of the vertical signal line Vline, and an offset component of the comparator 27.

Subsequently, at time t4, the power supply pulse φVdd<U, D> applied to the clipping pixel 21<U, D> drops from the pulse of the reference clip voltage Vddc to the pulse of the non-selected voltage Vddl. At this point, the potential Vpixout of the vertical signal line Vline which is an input of the comparator 27 at one end thereof drops from the clip potential Vclip to the vertical signal line potential Vk.

At time t5, the down count period begins. At this point, the potential Vpixout of the vertical signal line Vline changes, from the state at time t3 at which the operating point is determined, down by [Vclip−Vk] which is larger than a signal output. Accordingly, the potential of the node Nx also drops.

The potential of the reference signal RAMP decreases with a certain slope, and the potential of the node Mx also drops. During the down count period, the amount of decrease in potential of the node Mx is less than the amount of change in potential of the node Nx. Thus, a count value Caf corresponding to the down count period is held at the counter 28.

At time t12, the up count period begins. Moreover, the potential of the reference signal RAMP decreases with a certain slope, and the potential of the node Mx also drops. However, as in the down count period, if the potential change amount [Vclip−Vk] is sufficiently large, a drop in potential of the node Mx during a predetermined up count period is smaller than a drop in potential of the node Mx in association with the potential change amount [Vclip−Vk]. As a result, a count value Cbf corresponding to the up count period is held at the counter 28. Thus, [Cinit−Caf+Cbf] is written as a count value.

If the ADC circuit 25 has n-bit resolution, a margin for count value corresponding to the down count period is held during the up count period so that a count value of the nth power of two can be ensured as [Cinit−Caf+Cbf].

As in the foregoing, a sufficient signal output can be ensured without inversion of the output of the comparator 27 during the down count period and the up count period.

Depending on the value for clip potential Vclip of the vertical signal line Vline of the clipping pixel 21<U, D>, the output of the comparator 27 may be inverted during the up count period. In such a case, as long as a count value equal to or greater than a saturation output of the pixel is ensured as a count value, the blocked-up shadows can be reduced without problems.

The foregoing drive method can remove variation in pixels due to FPN by the clipping pixels 21<U, D>. Moreover, the set range of the reference clip voltage Vddc can be significantly extended. Thus, even when high-brightness light causing the blocked-up shadows enters the reading pixel 21<N>, the blocked-up shadows can be reduced by using the clipping pixels 21<U, D>.

Second Embodiment

A solid-state imaging apparatus of a second embodiment and a method for driving the solid-state imaging apparatus of the second embodiment will be described below with reference to drawings. Note that differences from the first embodiment will be mainly described.

Figure 11:
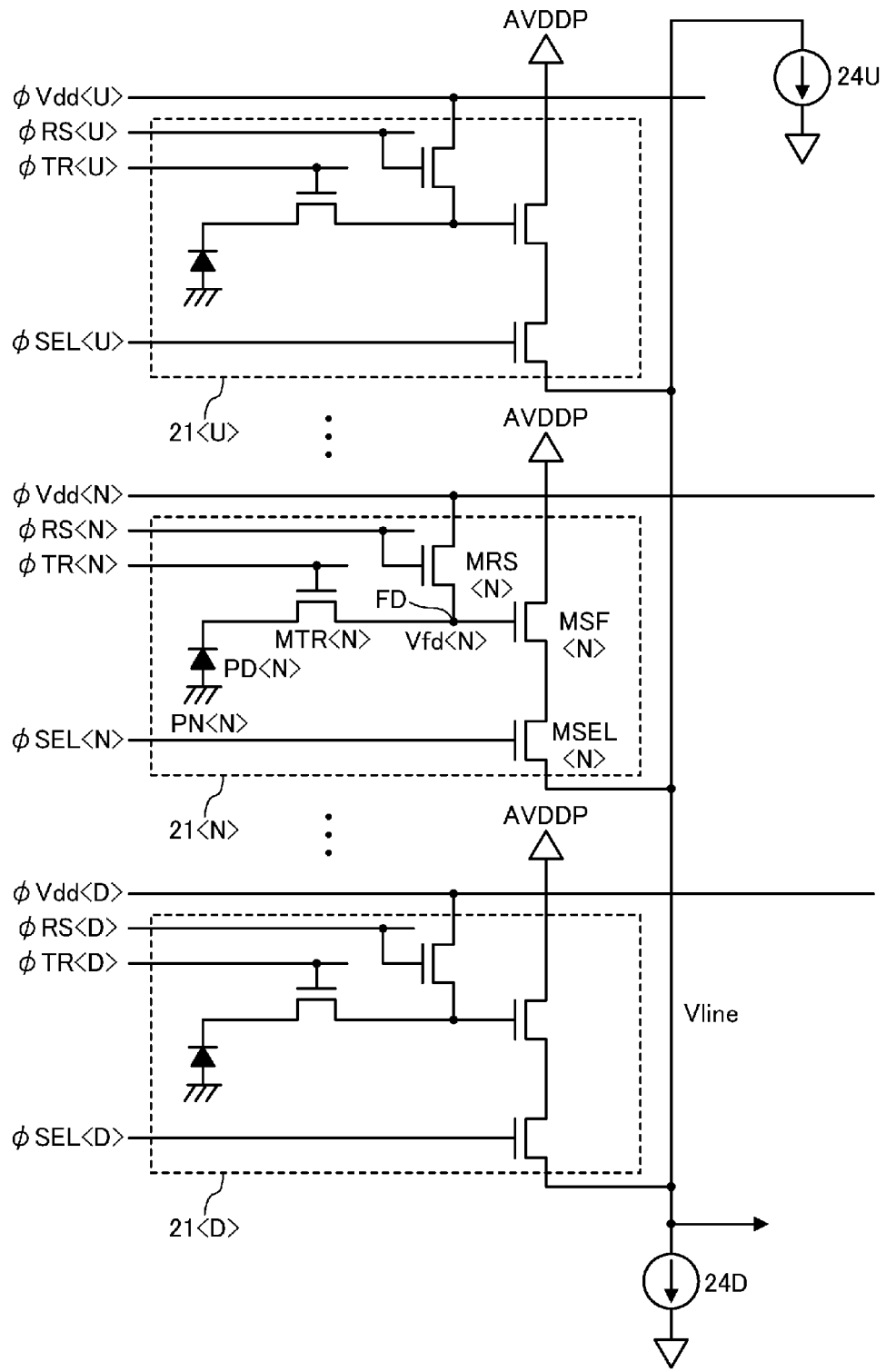
FIG. 11 is a configuration diagram illustrating a pixel array of an example solid-state imaging apparatus of a second embodiment.

FIG. 11 is a configuration diagram illustrating a pixel array 20 of the example solid-state imaging apparatus of the present embodiment. The differences from the first embodiment illustrated in FIG. 4 are that, in each unit pixel 21, a selector transistor MSEL is connected in series between an amplifier transistor MSF and a vertical signal line Vline. Moreover, a selection control line is connected to a gate of the selector transistor MSEL so that a selection pulse φSEL can be applied.

Although constant current sources 24 (24U and 24D) are arranged on upper and lower sides in FIG. 11, the constant current sources 24 may be arranged only on one side.

In the unit pixel 21, a single photodiode PD is provided for four transistors (i.e., a transfer transistor MTR, a reset transistor TRS, the amplifier transistor MSF, and the selector transistor MSEL). Alternately, in each unit pixel 21, a plurality of photodiodes PD and a plurality of transfer transistors MTR may be provided.

Figure 12:
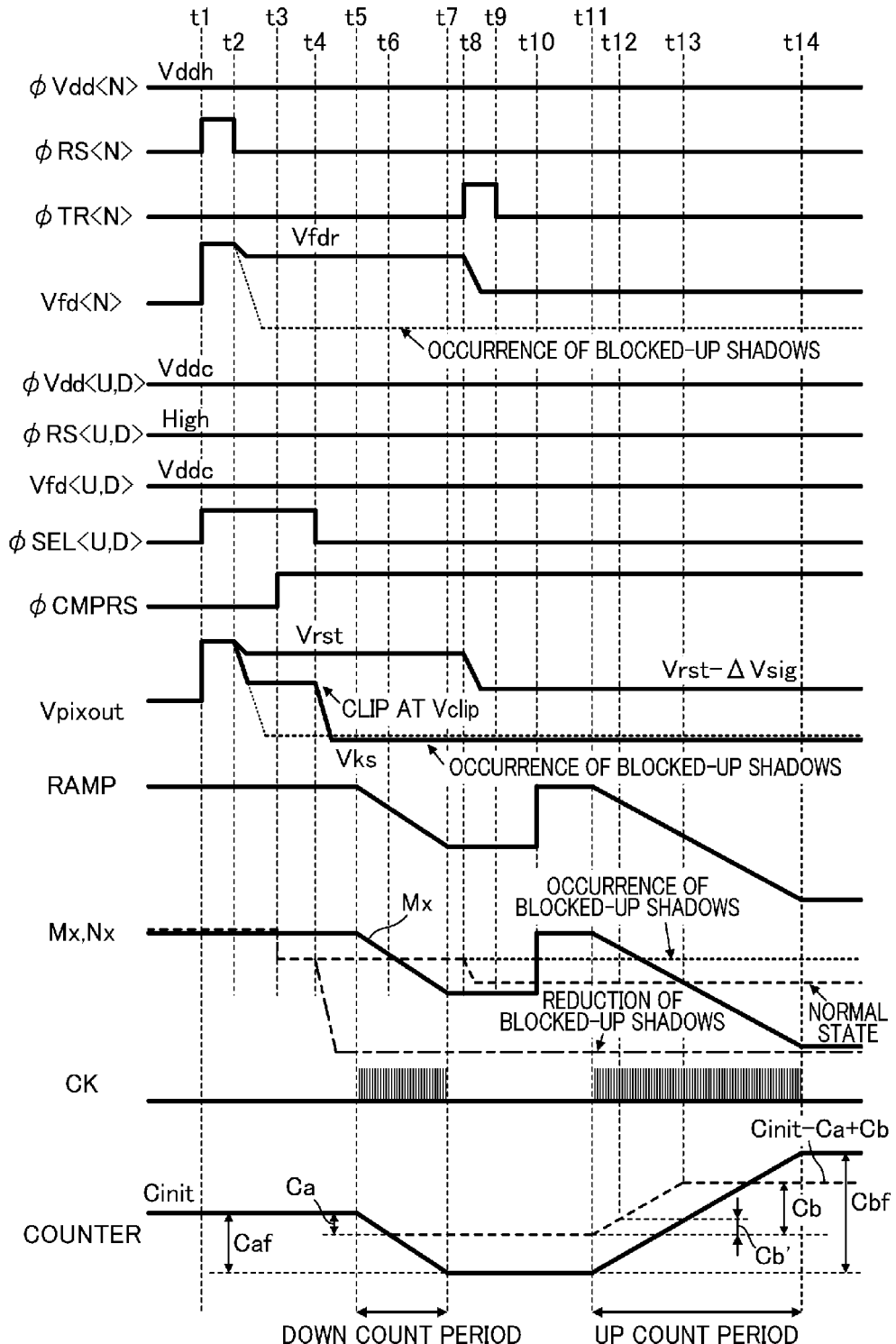
FIG. 12 is a chart illustrating an example of drive timing in order to describe a blocked-up shadow reduction operation in the solid-state imaging apparatus illustrated in FIG. 11.

FIG. 12 illustrates an example of drive timing in order to describe a blocked-up shadow reduction operation in the solid-state imaging apparatus of the present embodiment. Note that differences from the drive timing of the first embodiment as illustrated in FIGS. 9 and 10 will be mainly described.

A selection pulse φSEL<N> of a reading pixel 21<N> is fixed at a high level (not shown in the figure). Moreover, a selection pulse φSEL<U, D> of a clipping pixel 21<U, D> is input as a pulse at a certain time. Although not shown in the figure, a selection pulse φSEL<K> of the other pixel 21<K> other than the reading pixel 21<N> and the clipping pixels 21<U, D> is fixed at a low level.

A power supply pulse φVdd<U, D> of the clipping pixel 21<U, D> is fixed at reference clip voltage Vddc, and a reset pulse φRS<U, D> of the clipping pixel 21<U, D> is also fixed at the high level. Thus, the potential Vfd<U, D> of an FD part of the clipping pixel 21<U, D> is fixed at the reference clip voltage Vddc.

At time t1, a reset pulse φRS<N> is changed to the high level. Moreover, the potential Vfd<N> is changed to Vddh at the floating diffusion part FD of the reading pixel 21<N>, and the potential Vpixout of the vertical signal line Vline increases. Further, a selector transistor MSEL<U, D> of the clipping pixel 21<U, D> is turned ON.

At time t2, the reset pulse φRS<N> is changed to the low level. At this point, the potential Vpixout of the vertical signal line Vline is reset voltage Vrst. However, if high-brightness causing blocked-up shadows enters the reading pixel 21<N>, a pixel signal leaks from the photodiode PD, and is transferred to the FD part. As a result, the potential Vfd<N> drops as indicated by a dashed line.

In such a state, if no clipping pixel 21<U, D> is provided, the potential Vpixout of the vertical signal line Vline drops to Vks which is the potential corresponding to the potential Vfd<N>.

The potential Vks is lower than the vertical signal line potential Vk of the first embodiment. In the first embodiment, the vertical signal line potential Vk is determined depending on the non-selected pixel (i.e., the non-selected pixel voltage Vddl). However, in the present embodiment, each unit pixel 21 includes the selector transistor MSEL, and a selector transistor MSEL of a non-selected pixel is turned OFF. Thus, the potential Vpixout of the vertical signal line Vline is determined depending only on the reading pixel. The potential of the El) part of the reading pixel 21<N> becomes lower than non-selected pixel voltage Vddl upon occurrence of the blocked-up shadows. Thus, the potential Vks is lower than the vertical signal line potential Vk.

As in the present embodiment, if the clipping pixels 21<U, D> are provided, when high-brightness light enters, the potential Vpixout of the vertical signal line Vline is clipped at a clip potential Vclip determined depending on the reference clip voltage Vddc and the number of clipping pixels 21<U, D>. The clip potential Vclip is higher than the potential Vks.

At time t3, a reset pulse φCMPRS of a comparator 27 is changed to the high level, and a reset state of the comparator 27 is cleared.

At time t4, the selection pulse φSEL<U, D> of the clipping pixel 21<U, D> is changed to the low level. Thus, clipping of the potential of the vertical signal line Vline by the clipping pixels 21<U, D> is cleared.

In a normal state, since the potential Vpixout of the vertical signal line Vline is determined depending on the reading pixel 21<N>, the potential Vpixout does not change. Note that, if leakage current is generated at the clipping pixel 21<U, D>, an offset ΔVgs_noise is, as described in the first embodiment, removed from the potential Vpixout by clearing of clipping.

The potential Vpixout of the vertical signal line Vline is determined depending on the clipping pixels 21<U, D>. Thus, if high-brightness light causing the blocked-up shadows enters the reading pixel 21<N>, the potential Vpixout drops from the clip potential Vclip to the potential Vks. As a result, the potential Vpixout of the vertical signal line Vline which is an input of the comparator 27 at one end thereof drops to the potential Vks.

From time t5 on, the steps similar to those of the first embodiment as illustrated in FIGS. 9 and 10 are performed. Thus, such steps will be briefly described below.

First, the normal state will be described.

In the normal state, the output of the comparator 27 is inverted when the potential of a node Mx and the potential of a node Nx become equal to each other during a down count period, and a count value corresponding to a comparison period is held as a down count value at a counter 28.

At time t8, a transfer pulse φTR<N> of the reading pixel 21<N> is changed to the high level, and a pixel signal of the photodiode PD is transferred to the FD part. Thus, the potential Vfd<N> of the FD part drops, and the potential Vpixout of the vertical signal line Vline drops accordingly. Further, the potential of the node Nx also drops.

Subsequently, an up count period begins, and the output of the comparator 27 is inverted when the potential of the node Mx and the potential of the node Nx become, after a pixel signal is transferred, equal to each other during the up count period. A count value corresponding to the comparison period is held as an up count value at the counter 28. Thus, a difference between the up count value and the down count value is automatically held at the counter, and therefore a count value corresponding to a pixel signal is held.

Next, the case where high-brightness light causing the blocked-up shadows enters the reading pixel 21<N> and the blocked-up shadows occur will be described.

In such a case, the down count period begins at time t5. At this point, the potential Vpixout of the vertical signal line Vline changes, from the state at time t4 at which the operating point is determined, down by [Vclip−Vk] which is larger than an output signal. Although the potential of a reference signal RAMP drops with a certain slope, a drop in potential of the node Mx during the down count period is smaller than a drop in potential of the node Nx in association with [Vclip−Vk]. Thus, since the potential of the node Mx and the potential of the node Nx do not become equal to each other, a count value Caf corresponding to the down count period is held at the counter 28.

The up count period begins at time t12. The reference signal RAMP and the potential of the node Mx drop from initial values with a certain slope. However, as in the down count period, if the potential change amount [Vclip−Vk] is large, a drop in potential of the node Mx during a predetermined up count period is smaller than a drop in potential of the node Nx in association with the potential change amount [Vclip−Vk]. As a result, a count value Cbf corresponding to the up count period is held at the counter 28.

As in the foregoing, [Cinit−Caf+Cbf] is written as a count value, and a sufficient signal output is ensured.

Depending on the value for clip potential Vclip of the vertical signal line Vline of the clipping pixel 21<U, D>, the output of the comparator 27 may be inverted during the up count period. In such a case, as long as a count value equal to or greater than a saturation output of the pixel is ensured as a count value, the blocked-up shadows are reduced.

By the foregoing drive method, variation in pixels due to FPN can be removed by the clipping pixels 21<U, D>, and a set range of the reference clip voltage Vddc can be significantly extended. Thus, when high-brightness light causing the blocked-up shadows enters the reading pixel 21<N>, the blocked-up shadows can be reduced by using the clipping pixels 21<U, D>.

(Variation)

Figure 13:
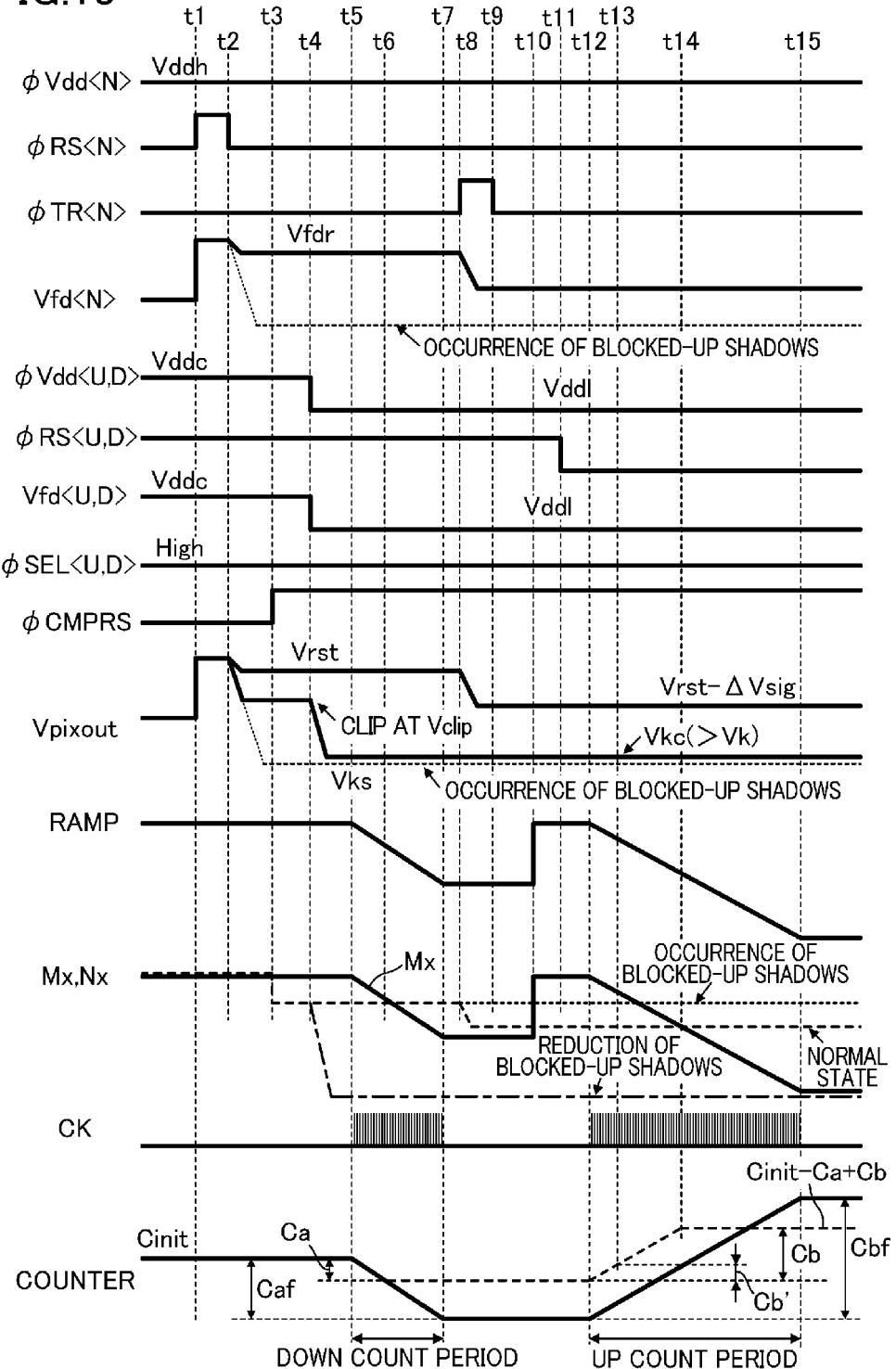
FIG. 13 is a chart illustrating an example of drive timing in order to describe a blocked-up shadow reduction operation with a function for reducing a drop in potential of a vertical signal line in the solid-state imaging apparatus illustrated in FIG. 11.

Next, FIG. 13 illustrates, as a variation, an example of drive timing in order to describe a blocked-up shadow reduction operation with a clipping function not to excessively decrease the potential Vpixout of the vertical signal line Vline. Note that differences from the drive timing of the first embodiment as illustrated in FIG. 10 will be mainly described.

The selection pulse φSEL<N> of the reading pixel 21<N> is fixed at the high level (not shown in the figure). Moreover, the selection pulse φSEL<U, D> of the clipping pixel 21<U, D> is input as a pulse at a certain time. Although not shown in the figure, the selection pulse φSEL<K> of the other pixel 21<K> other than the reading pixel 21<N> and the clipping pixels 21<U, D> is fixed at the low level.

Thus, even after a pulse is input as the transfer pulse φTR<N>, the selector transistor MSEL<U, D> of the clipping pixel 21<U, D> remains to be ON. Consequently, the potential Vpixout of the vertical signal line Vline is, as the minimum value, clipped at Vkc (>Vks) by the clipping pixel 21<U, D>.

The constant current source 24 has such a characteristic that, when the potential Vpixout of the vertical signal line Vline drops to some extent, a current value decreases. When a signal of a particular pixel is read, if high-brightness light enters the other pixel(s) of the same row as that of the particular pixel, the current value changes due to the foregoing current change. This provides an influence on a pixel(s) from which a pixel signal is read around the same time. That is, an offset of a pixel signal is generated, resulting in degradation of an image quality.

However, since the clipping pixels 21<U, D> are used as described above, a drop in potential Vpixout of the vertical signal line Vline is suppressed within a certain range, and the change in current value can be reduced. Thus, degradation of the image quality due to the current change can be reduced.

Third Embodiment

A solid-state imaging apparatus of a third embodiment and a method for driving the solid-state imaging apparatus of the third embodiment will be described below with reference to drawings. Note that differences from the second embodiment will be mainly described.

Figure 14:
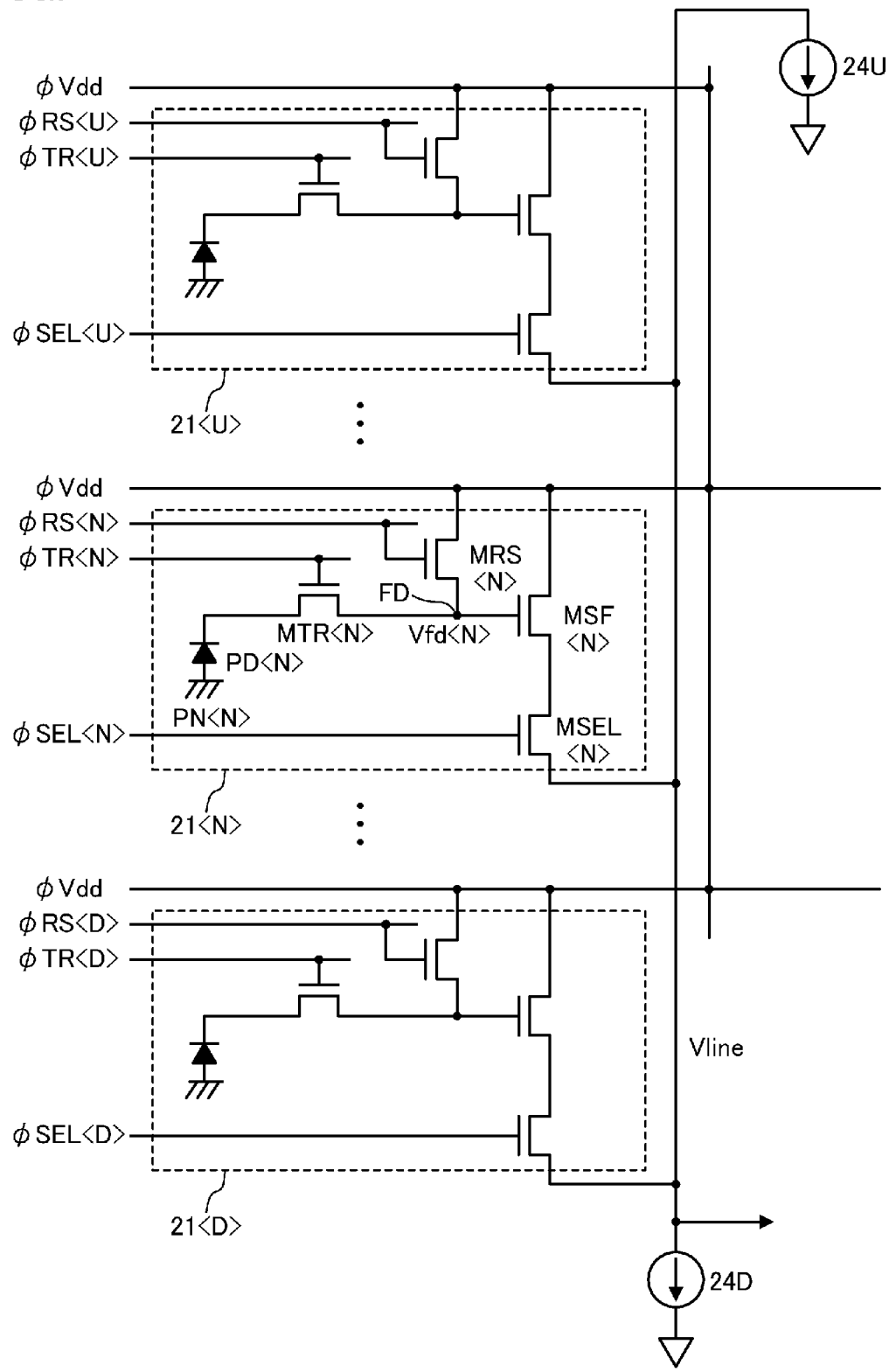
FIG. 14 is a configuration diagram illustrating a pixel array of an example solid-state imaging apparatus of a third embodiment.

FIG. 14 is a configuration diagram illustrating a pixel array 20 of the example solid-state imaging apparatus of the present embodiment. Differences from the second embodiment illustrated in FIG. 11 are as follows: in each unit pixel 21, a pixel power supply pulse line connected to a drain of a reset transistor MRS is connected to each row; and the pixel power supply pulse line is also connected to a drain of an amplifier transistor MSF.

Although constant current sources 24 (24U and 24D) are provided on upper and lower sides in FIG. 14, the constant current sources 24 may be provided only on one side. Moreover, although a single photodiode PD is provided for four transistor (i.e., a transfer transistor MRT, a reset transistor TRS, the amplifier transistor MSF, and a selector transistor MSEL) in each unit pixel 21, a plurality of photodiodes PD and a plurality of transfer transistors MTR may be provided in each unit pixel.

Figure 15:
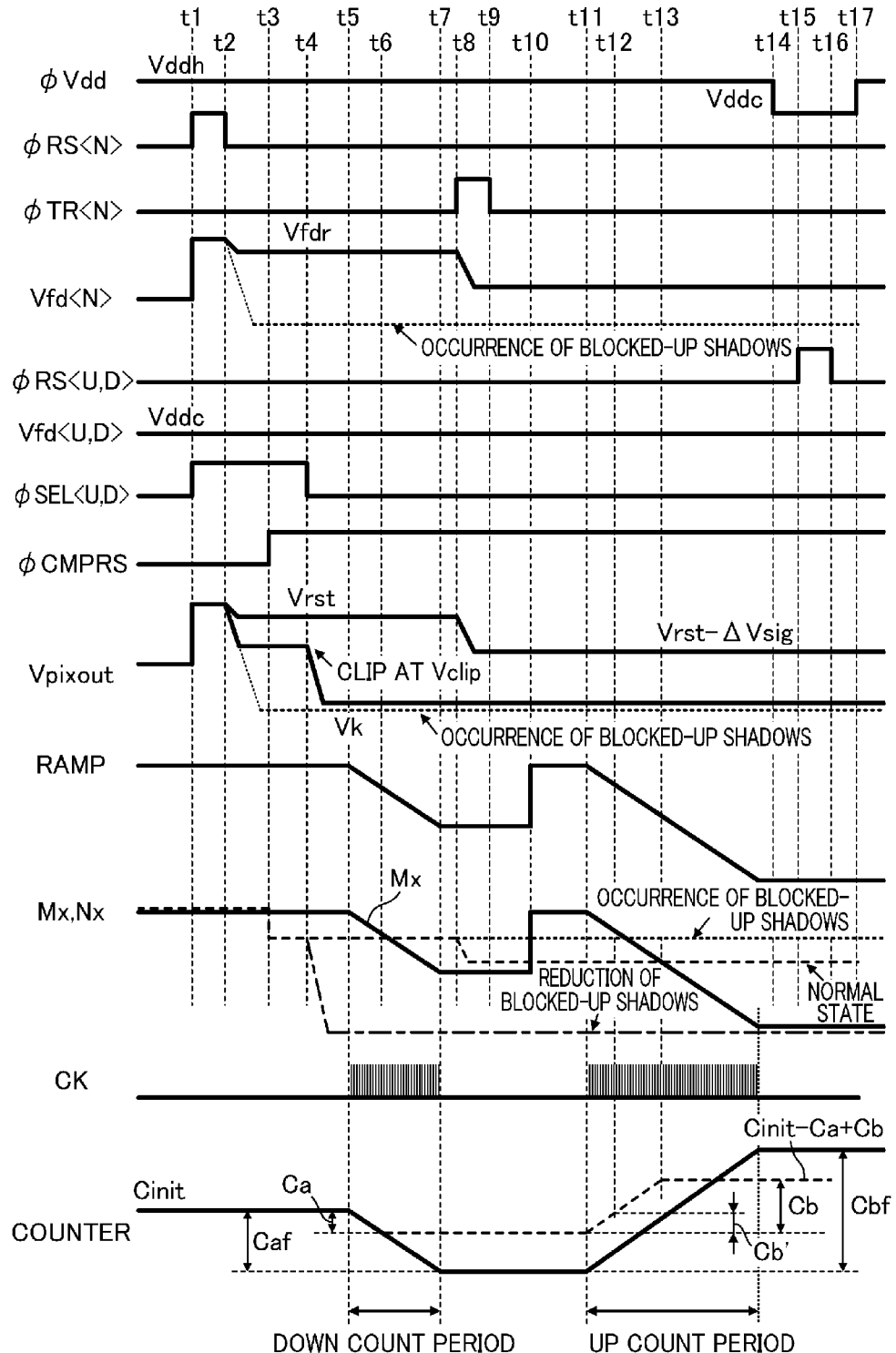
FIG. 15 is a chart illustrating an example of drive timing in order to describe a blocked-up shadow reduction operation in the solid-state imaging apparatus illustrated in FIG. 14.
Figure 16:
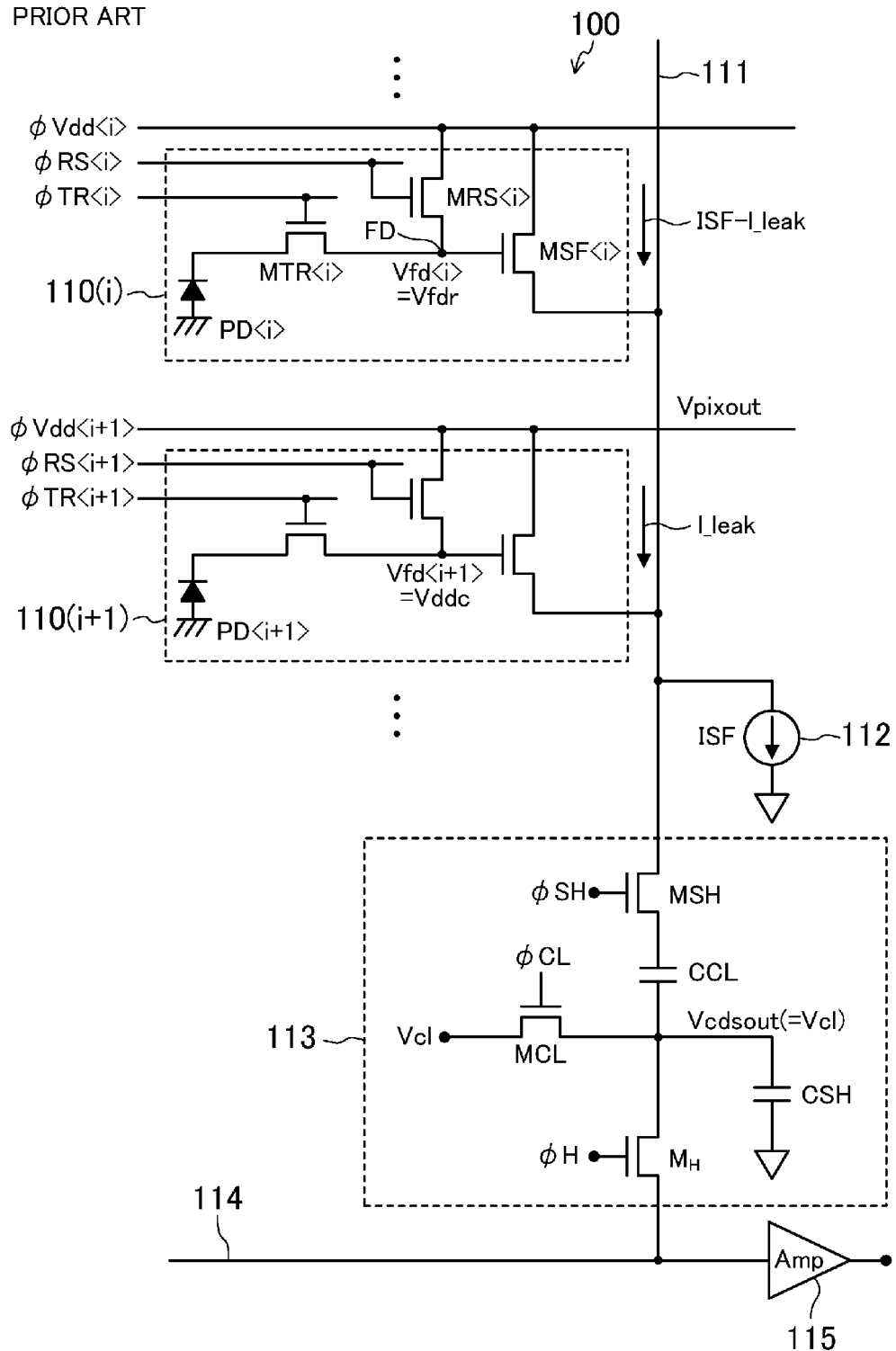
FIG. 16 is a configuration diagram of a solid-state imaging apparatus of the prior art.
Figure 17:
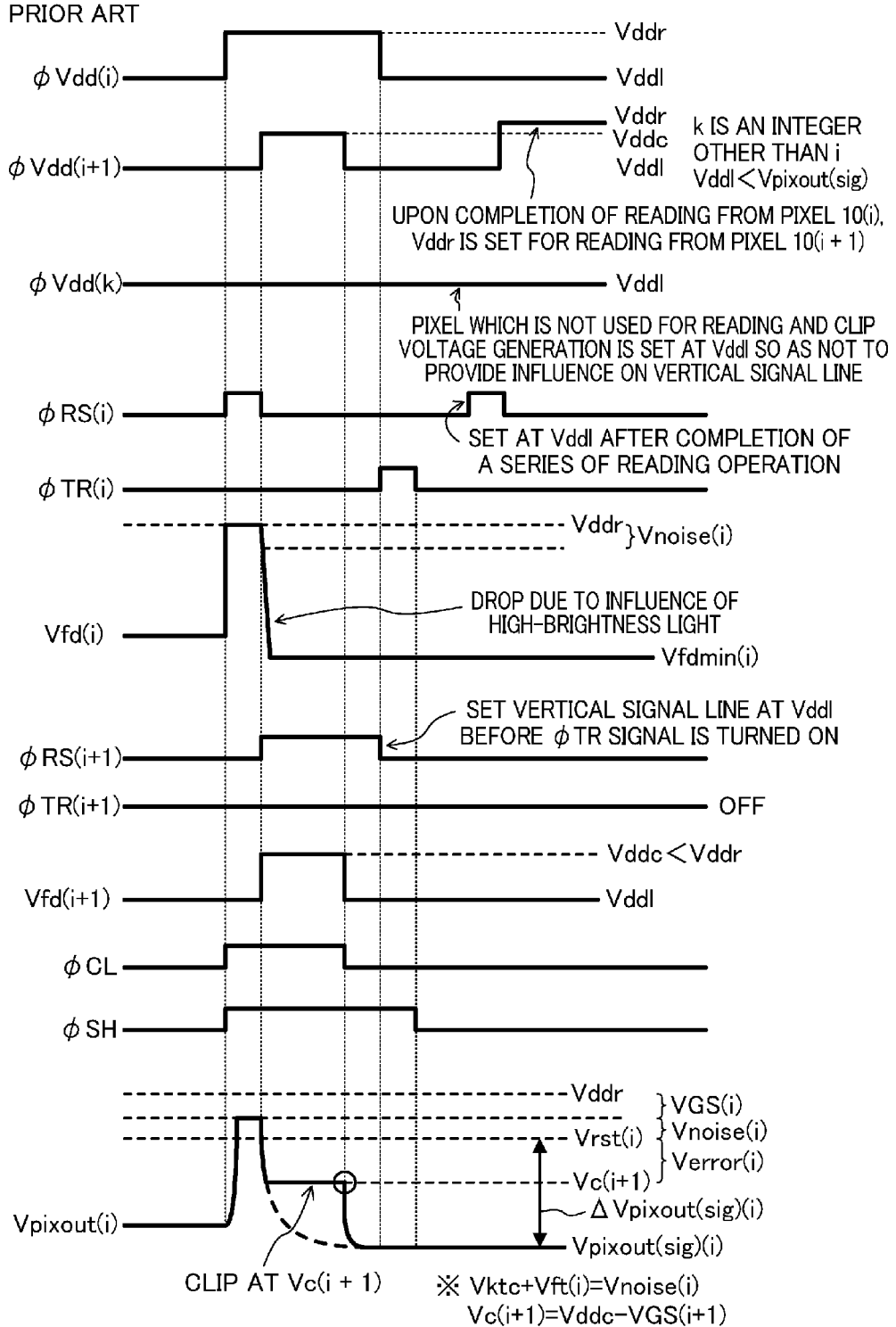
FIG. 17 is a chart illustrating drive timing in order to describe an operation of the solid-state imaging apparatus of the prior art.
Figure 18:
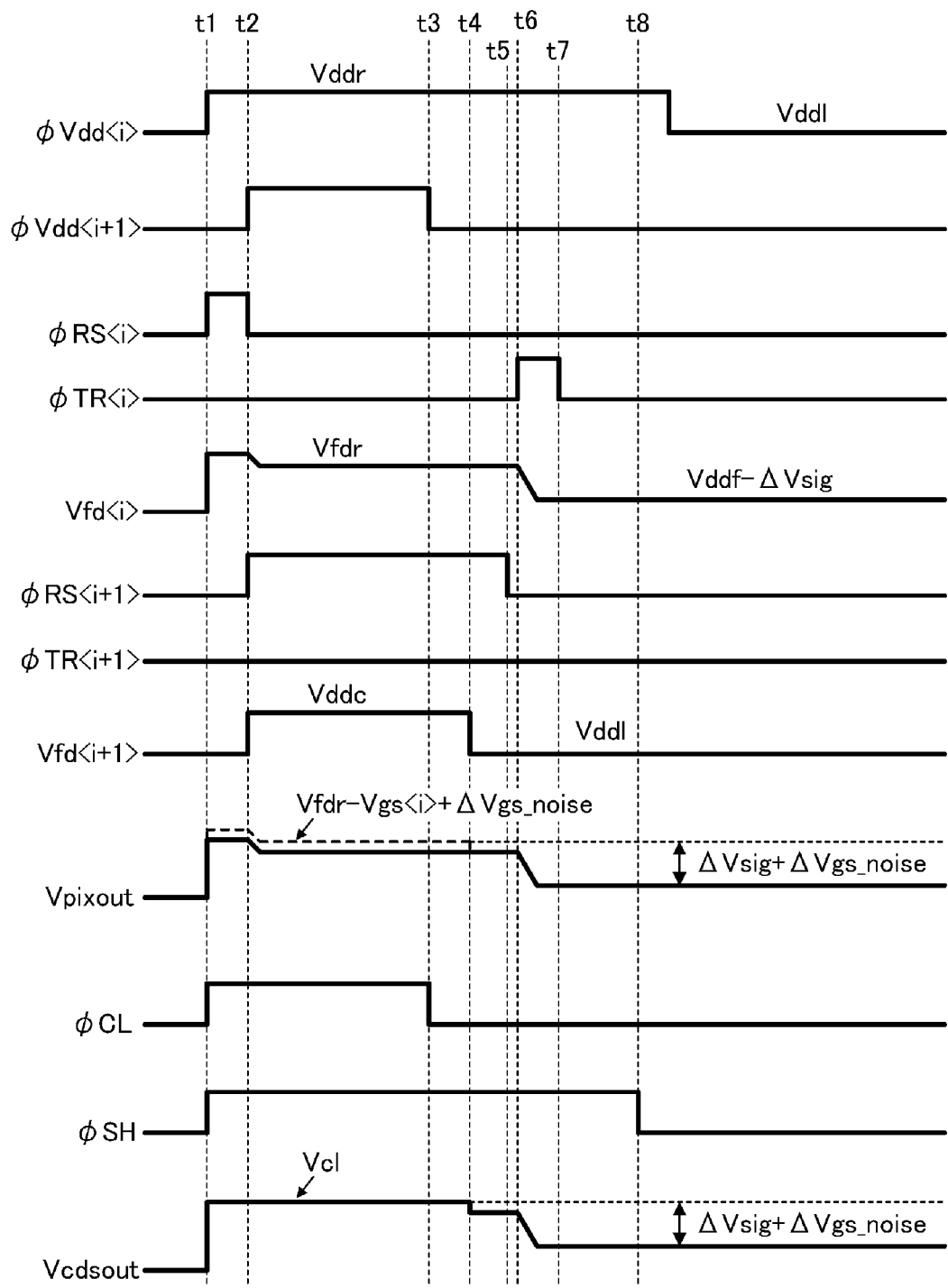
FIG. 18 is a chart illustrating drive timing in order to describe disadvantages of the solid-state imaging apparatus of the prior art.

FIG. 15 illustrates an example of drive timing in order to describe a blocked-up shadow reduction operation in the solid-state imaging apparatus of the present embodiment. Note that differences from the drive timing of the second embodiment illustrated in FIG. 12 will be mainly described.

The steps prior to time t14 are similar to those of the drive timing illustrated in FIG. 12, except that a reset pulse φRS<U, D> of a clipping pixel 21<U, D> is set at a low level.

At time t14, a pixel power supply pulse φVdd is changed from Vddh to the pulse of reference clip voltage Vddc.

At time t15, the reset pulse φRS<U, D> of the clipping pixel 21<U, D> is changed to a high level. Thus, the reference clip voltage Vddc is written as the potential Vfd<U, D> of an FD part of the clipping pixel 21<U, D>.

At time t16, the reset pulse φRS<U, D> of the clipping pixel 21<U, D> is changed to the low level, and the reference clip voltage Vddc is held as the potential Vfd<U, D> of the FD part of the clipping pixel 21<U, D>.

At time t17, the pixel power supply pulse φVdd is changed from the pulse of the reference clip voltage Vddc to Vddh, and a pixel reading operation with row cycles is completed.

At this point, since the reset pulse φRS<U, D> of the clipping pixel 21<U, D> is at the low level, a reset transistor MRS<U, D> is turned OFF. Thus, if high-brightness light causing blocked-up shadows enters the clipping pixel 21<U, D>, the potential Vfd<U, D> of the FD part drops, and therefore a clipping function is lost. For such a reason, it is necessary, as measures for avoiding occurrence of the blocked-up shadows, that the clipping pixels 21<U, D> are arranged in a light-shielded dummy pixel part 43b (see FIG. 2). Alternatively, it is necessary, as other measures, that no photodiode PD is provided in the clipping pixels 21<U, D>.

By the foregoing measures, the reference clip voltage Vddc written in the FD part of the clipping pixel 21<U, D> is held, and the blocked-up shadow reduction operation can be performed.

Thus, in the foregoing configuration, variation in pixels due to FPN can be removed by the clipping pixels 21<U, D>. Moreover, even if high-brightness light causing the blocked-up shadows enters a reading pixel 21<N>, the blocked-up shadows can be reduced by the clipping pixels 21<U, D>.

According to the solid-state imaging apparatus and the method for driving the solid-state imaging apparatus in the present disclosure, an increase in circuit size can be avoided, and, e.g., the blocked-up shadows and variation in pixels due to FPN can be reduced. As a result, an image quality can be improved. The solid-state imaging apparatus and the method for driving the solid-state imaging apparatus in the present disclosure are useful for, e.g., video cameras and digital cameras.

What is claimed is:

1. A solid-state imaging apparatus comprising:
a pixel array in which a plurality of unit pixels are arranged in a matrix; and
an analog-to-digital converter circuit arranged in parallel with each column of the pixel array and configured to convert the analog signal obtained at each unit pixel into a digital signal,
wherein each unit pixel includes
a photoelectric conversion element configured to perform photoelectric conversion,
a transfer transistor configured to transfer signal charge from the photoelectric conversion element to a floating diffusion part,
an amplifier transistor configured to amplify the signal charge and output the amplified signal charge to a signal output line as an analog signal, and
a reset transistor configured to reset the floating diffusion part by supplying a potential of a reset line to the floating diffusion part,
the pixel array includes
an effective pixel part which comprises a plurality of effective pixels and is formed in a light-irradiated pixel part where light enters the photoelectric conversion element of each of the plurality of effective pixels and in which the signal charge is used as a video signal,
an optical black pixel part which comprises a plurality of optical black pixels and is formed in a light-shielded pixel part where the photoelectric conversion element of each of the plurality of optical black pixels is shielded from light and in which the signal charge is used as a reference signal, and
a dummy pixel part comprising a plurality of dummy pixels and arranged in part of the pixel array other than the effective pixel part and the optical black pixel part,
the plurality of effective unit pixels of the effective pixel part and the plurality of dummy pixels of the dummy pixel part are connected to an identical signal output line,
in each effective pixels connected to the identical signal output line, a first potential is supplied from the reset transistor to the floating diffusion part,
the plurality of dummy pixels include a plurality of clipping pixels and remaining pixels,
in each of the plurality of clipping pixels among the dummy pixels connected to the identical signal output line, a second potential different from the first potential is supplied from the reset transistor to the floating diffusion part,
the analog-to-digital converter circuit includes
a comparator configured to compare a value for the signal output line to which the analog signal is output with a value for a reference line, and
a counter configured to count a time until comparison performed by the comparator is completed and hold a comparison result,
the comparator includes an initialization unit configured to initialize, before the comparison is performed, an operating point of the comparator based on predetermined values for the signal output line and the reference line, and
a control unit configured to change the value for the reference line after initialization is provided.

2. The solid-state imaging apparatus of claim 1, wherein the clipping pixels are positioned in the light-shielded pixel part.

3. The solid-state imaging apparatus of claim 1, wherein the dummy pixel part includes first and second dummy pixel parts arranged so as to sandwich the effective pixel part, and
the clipping pixels of the dummy pixels connected to the identical signal output line are arranged in both of the first and second dummy pixel parts.

4. The solid-state imaging apparatus of claim 1, wherein constant current circuits configured to supply constant current to the signal output line are arranged so as to sandwich the pixel array.

5. The solid-state imaging apparatus of claim 1, wherein the reset line is configured such that the potential thereof can be set for each row of the pixel array, and
different potentials are applied to the effective pixels and the clipping pixels through the reset line.

6. The solid-state imaging apparatus of claim 1, further comprising:
a unit configured to apply the second potential or a third potential lower than the second potential from the reset transistor to the floating diffusion part in each clipping pixel.

7. The solid-state imaging apparatus of claim 6, further comprising:
a first bias circuit configured to supply the second potential; and
a second bias circuit configured to supply the third potential,
wherein the second and third potentials are generated by using an identical reference potential.

8. The solid-state imaging apparatus of claim 6, wherein the second and third potentials are generated from a bias circuit which includes a potential switching controller and which is capable of dynamically switching a potential.

9. The solid-state imaging apparatus of claim 1, wherein each unit pixel further includes a selector transistor, and
the amplifier transistor is, at one end thereof, connected to the signal output line through the selector transistor.

10. The solid-state imaging apparatus of claim 1, wherein each unit pixel further includes a selector transistor,
the amplifier transistor is, at one end thereof, connected to the signal output line through the selector transistor, and
the reset line is shared by each row of the pixel array.

11. The solid-state imaging apparatus of claim 1, further comprising:
a unit configured to supply, after the initialization of the comparator and before a change in the value for the reference line, the third potential to the floating diffusion part of each clipping pixel,
wherein the third potential is lower than the second potential.

12. A solid-state imaging apparatus comprising:
a pixel array in which a plurality of unit pixels are arranged in a matrix: and
an analog-to-digital converter circuit arranged in parallel with each column of the pixel array and configured to convert the analog signal obtained at each unit pixel into a digital signal,
wherein each unit pixel includes
    a photoelectric conversion element configured to perform photoelectric conversion,
    a transfer transistor configured to transfer signal charge from the photoelectric conversion element to a floating diffusion part,
    an amplifier transistor configured to amplify the signal charge and output the amplified signal charge to a signal output line as an analog signal, and
    a reset transistor configured to reset the floating diffusion part by supplying a potential of a reset line to the floating diffusion part,
the pixel array includes
    an effective pixel part which comprises a plurality of effective pixels and is formed in a light-irradiated pixel part where light enters the photoelectric conversion element of each of the plurality of effective pixels and in which the signal charge is used as a video signal,
    an optical black pixel part which comprises a plurality of optical black pixels and is formed in a light-shielded pixel part where the photoelectric conversion element of each of the plurality of optical black pixels is shielded from light and in which the signal charge is used as a reference signal, and
    a dummy pixel part comprising a plurality of dummy pixels and arranged in part of the pixel array other than the effective pixel part and the optical black pixel part,
the plurality of effective unit pixels of the effective pixel part and the plurality of dummy pixels of the dummy pixel part are connected to an identical signal output line,
in each effective pixels connected to the identical signal output line, a first potential is supplied from the reset transistor to the floating diffusion part,
the plurality of dummy pixels include a plurality of clipping pixels and remaining pixels,
in each of the plurality of clipping pixels among the dummy pixels connected to the identical signal output line, a second potential different from the first potential is supplied from the reset transistor to the floating diffusion part,
each unit pixel further includes a selector transistor,
the amplifier transistor is, at one end thereof, connected to the signal output line through the selector transistor,
the analog-to-digital converter circuit includes
    a comparator configured to compare a value for the signal output line to which the analog signal is output with a value for a reference line, and
    a counter configured to count a time until comparison performed by the comparator is completed and hold a comparison result,
the comparator includes an initialization unit configured to initialize, before the comparison is performed, an operating point of the comparator based on predetermined values for the signal output line and the reference line,
a control unit configured to change the value for the reference line after initialization is provided, and
after the initialization of the comparator and before a change in the value for the reference line, the selector transistor at a second unit pixel is brought into a non-conductive state.

13. A method for driving a solid-state imaging apparatus including
a pixel array in which a plurality of unit pixels are arranged in a matrix,
an analog-to-digital converter circuit arranged in parallel with each column of the pixel array and configured to convert an analog signal obtained at each unit pixel into a digital signal, and
a potential supply unit,
in which each pixel unit includes
    a photoelectric conversion element configured to perform photoelectric conversion,
    a transfer transistor configured to transfer signal charge from the photoelectric conversion element to a floating diffusion part,
    an amplifier transistor configured to amplify the signal charge and output the amplified signal charge to a signal output line as an analog signal, and
    a reset transistor configured to reset the floating diffusion part by supplying a potential of a reset line to the floating diffusion part,
of the unit pixels, a plurality of effective pixels in each of which the signal charge is used as a video signal and a plurality of clipping pixels other than the effective pixels are connected to an identical signal output line,
in each effective pixel connected to the identical signal output line, the potential supply unit supplies a first potential from the reset transistor to the floating diffusion part,
in each clipping pixel connected to the identical signal output line, the potential supply unit supplies a second potential different from the first potential from the reset transistor to the floating diffusion part,
the analog-to-digital converter circuit includes
    a comparator configured to compare a value for the signal output line to which the analog signal is output and a value for a reference line, and
    a counter configured to count a time until comparison performed by the comparator is completed and hold a comparison result,
the comparator includes an initialization unit configured to initialize, before the comparison is performed, an operating point of the comparator based on predetermined values for the signal output line and the reference line, and
a control unit configured to change the value for the reference line after initialization is provided, the method comprising:
a step (a) of initializing the comparator;
a step (b) of applying, after the step (a), a third potential lower than the second potential from the reset transistor to the floating diffusion part at at least one of the unit pixels; and a step (c) of changing, after the step (b), the value for the reference line.

14. A method for driving a solid-state imaging apparatus including a pixel array in which a plurality of unit pixels are arranged in a matrix, an analog-to-digital converter circuit arranged in parallel with each column of the pixel array and configured to convert an analog signal obtained at each unit pixel into a digital signal, and a potential supply unit, in which each pixel unit includes a photoelectric conversion element configured to perform photoelectric conversion, a transfer transistor configured to transfer signal charge from the photoelectric conversion element to a floating diffusion part, an amplifier transistor configured to amplify the signal charge and output the amplified signal charge to a signal output line as an analog signal, and a reset transistor configured to reset the floating diffusion part by supplying a potential of a reset line to the floating diffusion part, of the unit pixels, a plurality of effective pixels in each of which the signal charge is used as a video signal and a plurality of clipping pixels other than the effective pixels are connected to an identical signal output line, in each effective pixel connected to the identical signal output line, the potential supply unit supplies a first potential from the reset transistor to the floating diffusion part, in each clipping pixel connected to the identical signal output line, the potential supply unit supplies a second potential different from the first potential from the reset transistor to the floating diffusion part, the analog-to-digital converter circuit includes a comparator configured to compare a value for the signal output line to which the analog signal is output and a value for a reference line, and a counter configured to count a time until comparison performed by the comparator is completed and hold a comparison result, the comparator includes an initialization unit configured to initialize, before the comparison is performed, an operating point of the comparator based on predetermined values for the signal output line and the reference line, and a control unit configured to change the value for the reference line after initialization is provided, the method comprising:

a step (a) of initializing the comparator;

a step (b) of bringing, after the step (a), a selector transistor of at least one of the unit pixels into a non-conductive state; and a step (c) of changing, after the step (b), the value for the reference line.

* * * * *